United States Patent [19]
Fujishima et al.

[11] Patent Number: 5,436,486
[45] Date of Patent: Jul. 25, 1995

[54] HIGH VOLTAGE MIS TRANSISTOR AND SEMICONDUCTOR DEVICE

[75] Inventors: Naoto Fujishima; Akio Kitamura; Gen Tada, all of Kawasaki, Japan

[73] Assignee: Fuji Electric Co., Ltd., Kanagawa, Japan

[21] Appl. No.: 137,355

[22] Filed: Oct. 18, 1993

[30] Foreign Application Priority Data

Oct. 19, 1992 [JP] Japan .................. 4-279615

[51] Int. Cl.[6] ............... H01L 29/72; H01L 29/08
[52] U.S. Cl. ................... 257/378; 257/577; 257/146; 257/140
[58] Field of Search ............ 257/378, 577, 140, 141, 257/133, 146

[56] References Cited

U.S. PATENT DOCUMENTS

3,609,413  9/1971  Lane et al. .................. 257/378

FOREIGN PATENT DOCUMENTS

| | | | |
|---|---|---|---|
| 0164106A3 | 12/1985 | European Pat. Off. | 257/378 |
| 0272754A3 | 6/1988 | European Pat. Off. | 257/378 |
| 0280535A3 | 8/1988 | European Pat. Off. | 257/378 |
| 0334659A3 | 9/1989 | European Pat. Off. | 257/378 |
| 0371785A2 | 6/1990 | European Pat. Off. | 257/378 |
| 4-18763 | 1/1992 | Japan | 257/378 |

OTHER PUBLICATIONS

"A CMOS-Compatible High-Voltage IC Process", Parpia et al., IEEE Transactions On Electron Devices, vol. 35, No. 10, pp. 1687–1694, Oct. 1988.
"Two Types of 500V Double Gate Lateral N-ch Bipolar-Mode MOSFETs in Dielectrically Isolated P- and N-Silicon Islands", Nakagawa et al., IEEE, IEDM 88, pp. 817–820, 1988.
"New Anode Structure for High Voltage Lateral IGBTs", Yamaguchi et al., Extended Abstracts of the 22nd (1990 International) Conference on Solid State Devices and Materials, Sendai, pp. 677–680, 1990.

*Primary Examiner*—Jerome Jackson
*Assistant Examiner*—Donald L. Monin, Jr.
*Attorney, Agent, or Firm*—Finnegan, Henderson, Farabow, Garrett & Dunner

[57] ABSTRACT

A high voltage MIS transistor includes a well region of a second conduction type formed by a step of injecting ions from the surface side of a semiconductor substrate of a first conduction type and a thermal diffusion step after the ion injecting step; an MIS part including a base layer of a first conduction type formed in one end portion of the well region, a base contact layer of a first conduction type which is formed in the base layer of a first conduction type and to which an emitter potential is applied, and a gate electrode provided so as to extend from an emitter layer of a second conduction type to the well region through an insulation gate film; and, a collector part including a base layer of a second conduction type formed in the other end portion of the well region, a collector layer of a first conduction type formed in the base layer of a second conduction type, and a high concentration contact layer of a first conduction type which is formed in the collector layer and to which a collector potential is applied.

7 Claims, 13 Drawing Sheets

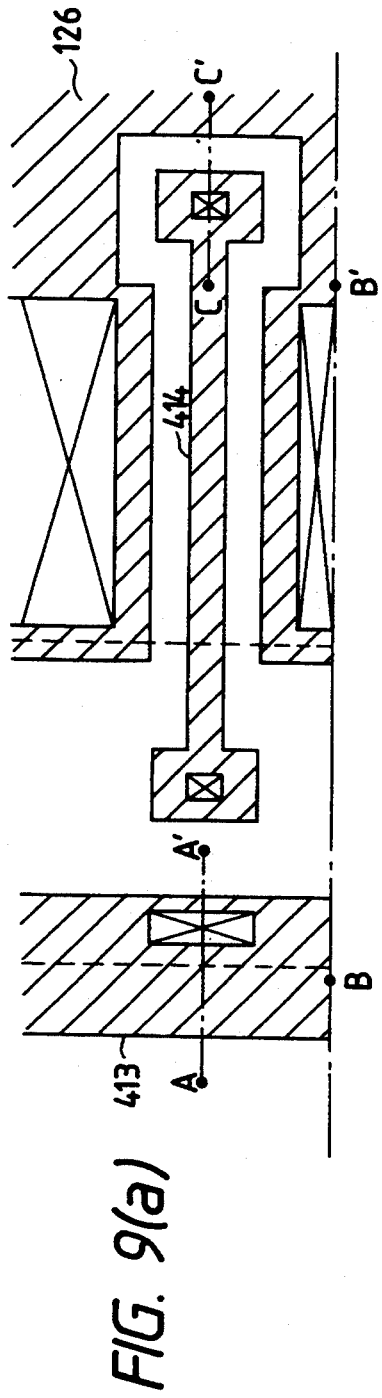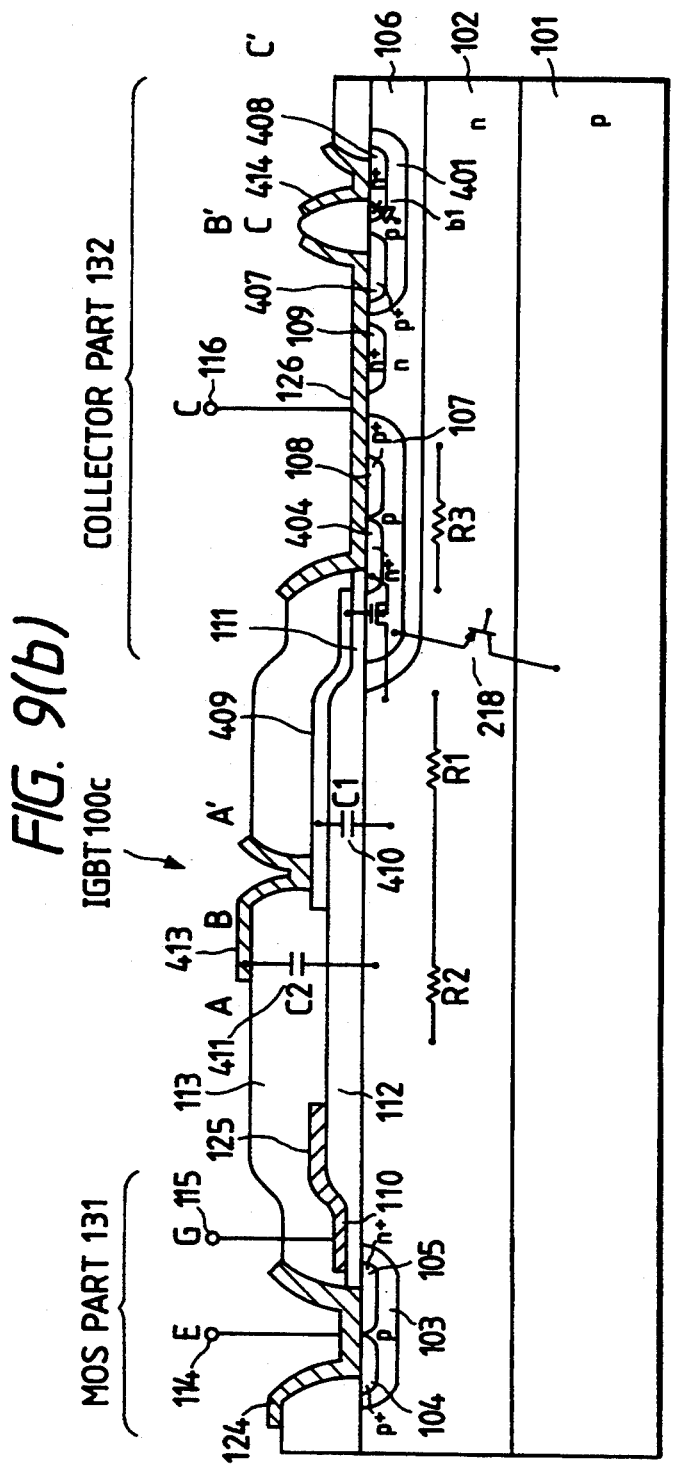
FIG. 9(a)
FIG. 9(b)

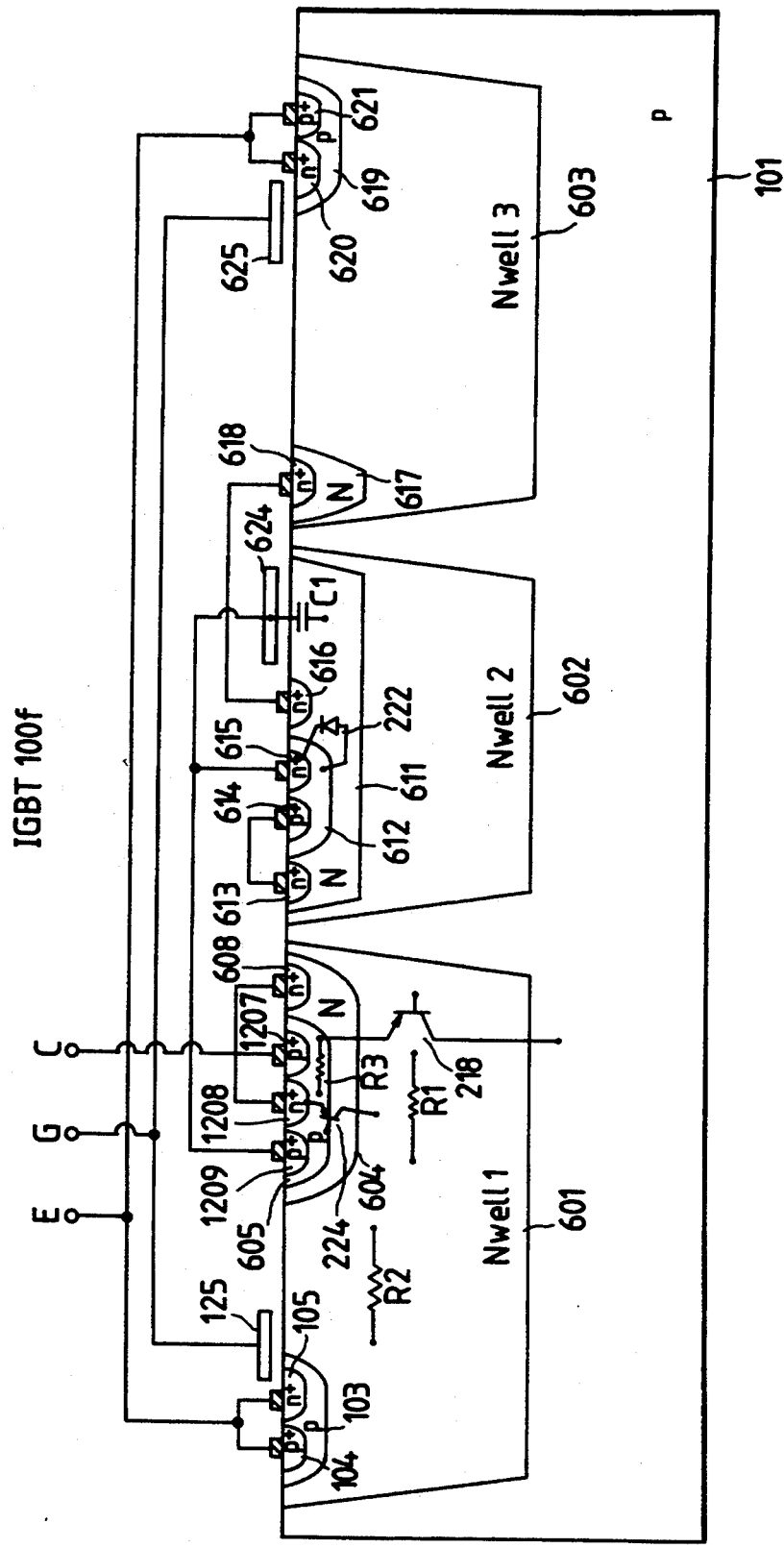

HIGH VOLTAGE MIS TRANSISTOR AND SEMICONDUCTOR DEVICE

BACKGROUND OF THE INVENTION

The present invention relates to the structure of a high voltage MIS transistor and, in more particular, to an integrating technology which aims at reducing integration loss and enhancing device reliability in integrating such a transistor with a CMOS transistor or the like.

In FIG. 19, there is shown the structure of a conventional high voltage MOS transistor. The high voltage MOS transistor is an IGBT of a horizontal type which can be driven or controlled by a gate signal to be given to a gate electrode 2111. In the high voltage MOS transistor, an emitter region to which an emitter electrode 2114 is connected is spaced apart from a collector region to which a collector electrode 2115 is connected, whereby there is secured an emitter-collector voltage withstanding. Also, in the high voltage IBGT, a p-type buried layer 2102 is formed on the surface side of a p-type semiconductor substrate 2101, and an n-type epitaxial layer 2103 laid on the surface side of both the substrate 2101 and layer 2102 is separated into a semiconductor island region by a p-type isolation diffusion layer 2104 which is formed so as to extend from the surface side of the epitaxial layer 2103 to the buried layer 2102. In one end portion of the epitaxial layer 2103, there is provided a p-type base layer 2109 which is formed by diffusion so as to extend from the epitaxial layer 2103 to the isolation diffusion layer 2104, while on the surface of the base layer 2109 there are formed an n+-type emitter layer 2108 and a p+-type base contact layer 2107. And, the emitter electrode 2114 is connected to both the emitter layer 2108 and base contact layer 2107. Also, the epitaxial layer 2103 includes in the other end portion thereof an n-type base layer 2105 which is formed by diffusion, a p-type collector layer 2106 which is formed on the surface of the base layer 2105, and a p+-type contact layer 2110 which is formed inside the collector layer 2106. And, the collector electrode 2115 is connected to the contact layer 2110. Also, on the surfaces of the n+-type emitter layer 2108, p-type base layer 2109 and n-type epitaxial layer 2103, there is provided the gate electrode 2111 through a gate oxidized film 2112. On the surface of the epitaxial layer 2103, there is provided an oxidized film 2113 which is formed by extending the gate oxidized film 2112 integrally therewith and is greater in thickness than the oxidized film 2112.

In the high voltage IGBT having the above-mentioned structure, if a collector voltage, which is positive with respect to an emitter potential to be applied to the emitter electrode 2114, is applied to the collector electrode 2115 and a gate potential, which is positive with respect to the emitter potential, is applied to the gate electrode 2111, then the surface of the base layer 2109 just below the gate electrode 2111 is inverted to operate as a channel, so that a MOSFET consisting of the emitter layer 2108, base layer 2109 and epitaxial layer 2103 turns on. As result of this, electrons flow from the emitter electrode 2114 through the emitter layer 2108 and the channel formed on the surface of the base layer 2109 into the epitaxial layer 2103. This means that a base current is supplied to a first pnp transistor consisting of the collector layer 2106, epitaxial layer 2103 and semiconductor substrate 2101 and to a second pnp transistor consisting of the collector layer 2106, epitaxial layer 2103 and base layer 2109 and thus the first and second pnp transistors are caused to turn on. This causes the collector layer 2106 to inject positive holes into the epitaxial layer 2103, so that the epitaxial layer 2103 is turned into a so-called conductivity modulation state in which electrons and holes exist together. In other words, the high voltage IGBT is operable at a low on-voltage and is also able to handle a high current.

Here, in the high voltage IGBT, since the gate electrode 2111 is disposed in such a manner as to extend over the gate oxidized film 2112 and the thicker oxidized film 2113, the gate electrode 2111 can relax the electric concentration at the collector terminal of the gate electrode 2111 and thus the device voltage resistance can be maintained.

Also, the collector region has a dual diffusion structure in which the collector layer 2106 is formed within the base layer 2105 and, for this reason, when the device is off, it is possible to prevent the punch-through of a depletion layer which extends from a pn junction between the epitaxial layer 2103 and the base layer 2109, isolation diffusion layer 2104, buried layer 2102 and semiconductor substrate 2101.

Referring now to FIGS. 20 (a) and 20 (b) there is shown another example of a conventional high voltage MOS transistor. This high voltage MOS transistor is an n-channel type lateral MOSFET which is driven and controlled by a gate signal applied to a gate electrode 2124 and has a high voltage structure. In particular, FIG. 20 (a) is a plan view of the structure of the high voltage MOSFET and FIG. 20 (b) is a section view taken along the line A—A' shown in FIG. 20 (a). In FIG. 20, parts corresponding to those shown in FIG. 19 are given the same designations. The high voltage MOSFET includes a p-type semiconductor substrate 2101, a p-type buried layer 2102 formed on the surface side of the semiconductor substrate 2101, an n-type epitaxial layer 2103 formed on the surface side of the substrate 2101 and buried layer 2102, and a p-type isolation diffusion layer 2104 which isolates the epitaxial layer 2103 to a semiconductor island region. And, within a p-type base layer 2109 formed so as to extend from one end portion of the epitaxial layer 2103 to the isolation diffusion layer 2104, there are formed a p+-type base contact layer 2107 and an n+-type source layer 2121, to both of which a source electrode 2125 is connected. Also, on the surface of the other end portion of the epitaxial layer 2103, there is formed an n+-type drain layer 2122 to which a drain electrode 2123 is connected. Further, on the surfaces of the source layer 2121, base layer 2109 and epitaxial layer 2103, there is provided the gate electrode 2124 through a gate oxidized film 2112. In this high voltage MOSFET, for the drain electrode 2123 which is situated in the central portion of the device, a drain pad 2128 is provided externally of the element and the drain electrode 2123 is connected to the drain pad 2128 by means of a drain wire 2126, so that wiring can be achieved easily in integration. The drain wire 2126 is also connected to the epitaxial layer 2103, source layer 2121 and gate electrode 2124 through an inter-layer insulation film 2127 which is formed on the top portions thereof.

In recent years, there has been an increased development of a power IC which can integrate a power transistor with a high withstand voltage of several hundred V (volts) or more and a high current output of the order of several A (amperes) and a control circuit part operable on a low voltage of about 5 V into one chip, and the power IC has been widely applied to household electrical appliances and the like. In order to realize such power IC at low costs, it is indispensable to reduce the size of the chip. Therefore, in the power IC, it is important to reduce the size of the power transistor part which occupies a large area. Also, in manufacturing the power transistor part, if the number of manufacturing steps thereof is increased, then it is impossible to reduce the manufacturing costs of the power IC.

However, in the above-mentioned conventional high voltage MOS transistor, due to the fact that the element isolation must be taken into consideration, and the formation of the embedded layer, the epitaxial growth and the formation of the isolation diffusion layer are also necessary, when combining these components into one chip to thereby form an integrated circuit, the number of manufacturing steps is increased, which results in expensive costs. Also, although the high voltage IGBT shown in FIG. 19 is operable at a low on voltage due to the conductivity modulation of the epitaxial layer 2103 and is also able to handle a high current, because the pnp transistor becomes saturated, when the IGBT is turned off, it takes a long time to sweep out minority carriers stored in the epitaxial layer 2103 and semiconductor substrate 2101, which provides a great loss when performing a high speed switching in the range of 200 kHz to 1 MHz. Further, because of flow of a great sweeping current, a parasitic thyristor is actuated to cause a fear that the turn-off capability itself is lost.

On the other hand, in the high voltage MOSFET shown in FIG. 20, because a depletion layer spreads in a lateral direction, in order to secure a required withstand voltage, a long offset layer is necessary. However, it is difficult to secure the sectional area of the offset layer and, therefore, when the MOSFET is on, resistance easily increases. Also, as mentioned above, the drain wire 2126 connecting the drain electrode 2123 to the drain pad 2128 is disposed above the epitaxial layer 2103, source layer 2121 and gate electrode 2124 through the inter-layer insulation film 2127. However, in an LSI process, the inter-layer insulation film 2127 can be formed such that the thickness thereof is only of about 6000 Å to 10000 Å and, for this reason, when a high potential is applied to the drain electrode 2123, an excessive electric field concentration occurs in the drain side end portion of the gate electrode 2124. As a result of this, even if a sufficient distance is secured between the gate electrode 2124 and drain layer 2122, only the withstand voltage of 200 V can be realized and thus it is difficult to secure the reliability of the device.

SUMMARY OF THE INVENTION

The present invention aims at eliminating the above-mentioned problems found in the conventional high voltage MOSFET and IGBT. Accordingly, it is an object of the present invention to realize a high voltage MIS transistor which can be disposed with elements forming a control circuit part such as a CMOS on the same substrate, is highly reliable, and has a sufficient withstand voltage.

In achieving the above object, according to the present invention, there is provided a high voltage MIS transistor which includes a well region of a second conduction type formed by a step of injecting ions from the surface side of a semiconductor substrate of a first conduction type and a thermal diffusion step to follow the ion injecting step; an MIS part comprising a base layer of a first conduction type formed in one end portion of the well region, a base contact layer of a first conduction type which is formed in the base layer of a first conduction type and to which an emitter potential is applied, and a gate electrode provided so as to extend from an emitter layer of a second conduction type to the well region through an insulation gate film; and, a collector part comprising a base layer of a second conduction type formed in the other end portion of the well region, a collector layer of a first conduction type formed in the base layer of a second conduction type, and a high concentration contact layer of a first conduction type which is formed in the collector layer and to which a collector potential is applied.

In this high voltage MIS transistor, in order to enable high speed switching, it is effective that a high concentration drain layer of a second conduction type is formed between an MOS part in the well region and the collector layer and also that an external circuit, which includes a switching element to be able to connect the well region to the collector layer in a short-circuit manner, is connected to the drain layer. Also, it is effective that a high concentration source layer of a second conduction type as a source of a switching element, which is able to connect the well region and collector layer respectively added to the semiconductor substrate in a short-circuit manner, is formed in the collector layer and a collector potential is applied thereto. A drive source of the switching element, preferably, may be a capacitor which is formed structurally on the semiconductor substrate and, as the switching element, there may be employed an MISFET or a bipolar transistor.

Further, a semiconductor device including such a high voltage MIS transistor, preferably, may have a plane structure that, with a collector layer disposed as the center thereof, a high resistance well region and emitter layer between the collector layer and emitter layer are formed substantially concentrically with each other. And, referring to a plurality of semiconductor isolation regions which form the switching element, it is preferable that the high potential isolation regions, that is, the isolation regions each having a high potential in the neighborhood of output potentials, are formed in the central portion of the switching element while the low potential isolation regions each having a low potential in the neighborhood of input potentials, are formed in the circumferential portion of the switching element.

The high voltage MIS transistor of the present invention including the above-mentioned various means is characterized in that a well region is formed by a step of injecting ions from the surface side of a semiconductor substrate and by a thermal diffusion step to follow the ion injecting step. Therefore, in integrating this high voltage MIS transistor together with elements forming a control circuit part such as a CMOS, there are eliminated steps necessary for only this high voltage MIS transistor such as an buried layer forming step and epitaxial growth step, and thus the present high voltage MIS transistor can be formed in the same step as the impurity region of elements forming the control circuit part. This can reduce the number of manufacturing steps and also makes it possible to provide an integrated circuit at low costs. Also, since it is not necessary to form an isolation diffusion layer, it is possible to reduce the device area. Further, due to the fact that the impurity concentration of the semiconductor substrate can be set lower than that of the well region, a depletion layer to spread from a junction between the semiconductor substrate and well region, when an inverse bias is applied, will spread mainly toward the semiconductor substrate, so that a wide range of spreading depletion layer can be secured to thereby enable the element to withstand a high voltage. At the same time, because the impurity concentration of the well region can be set relatively higher, a main current flow passage can be of a low resistance, so that a low on resistance is compatible with a high voltage. Further, since the impurity distribution of the well region conforms substantially to a Gaussian distribution, the impurity concentration can be made more uniform than a conventional offset layer which is formed by the epitaxial growth, an electric field distribution within the depletion layer spreading from the junction between the semiconductor substrate and well region is further improved in uniformity, which makes it possible to realize a further improved structure with a high withstand voltage.

And, in this high voltage MIS transistor, due to the fact that the switching element capable of connecting the emitter and base of the main current flow passage in a short-circuit manner is realized by combining a plurality of elements and thus, when the element is turned off, minority carriers to be stored in the well region can be drawn out fast to the emitter side, a time necessary to sweep out the stored carriers can be reduced to a great extent, which enables the element to realize a high speed switching operation. Here, when a capacitor formed structurally on the semiconductor substrate is used as a drive source for the switching element, there is eliminated the need for a signal terminal which is used to control the switching element, which makes it easy to design the element and also makes it possible to simplify wiring.

Further, when a substantially concentric structure is employed as a plane structure of a semiconductor device including the high voltage MIS transistor of the invention, by connecting a high voltage output wire from the central portion of the element to a package terminal by use of an aerial wire, there is eliminated the need to make the high voltage wire creep along the element to thereby prevent generation of electric field concentration due to the high voltage output wire, which can improve the reliability of the voltage withstanding of the device. That is, since there can be secured the reliability of the MIS part of this semiconductor device that has a great influence on the control circuit part thereof, it is possible to improve the reliability of an integrated circuit device which uses the high voltage MIS transistor of the present invention. Also, there is eliminated the need to treat the end portions of the respective layers, with the result that the integrated circuit device is easy to manufacture and to design.

BRIEF DESCRIPTION OF THE DRAWINGS

FIG. 9 (a) is a plan view showing the structure of a high voltage IGBT according to a fourth embodiment of the present invention;

FIG. 9 (b) is a sectional view showing the IGBT of FIG. 9(a);

FIG. 15 is a sectional view showing the structure of a high voltage IGBT according to a seventh embodiment of the present invention;

FIG. 17 (b) is a plan view showing the MOSFET of FIG. 17 (a);

DETAILED DESCRIPTION OF THE INVENTION

Preferred embodiments of the present invention will now be described with reference to the accompanying drawings.

[Embodiment 1]

Figure 1:
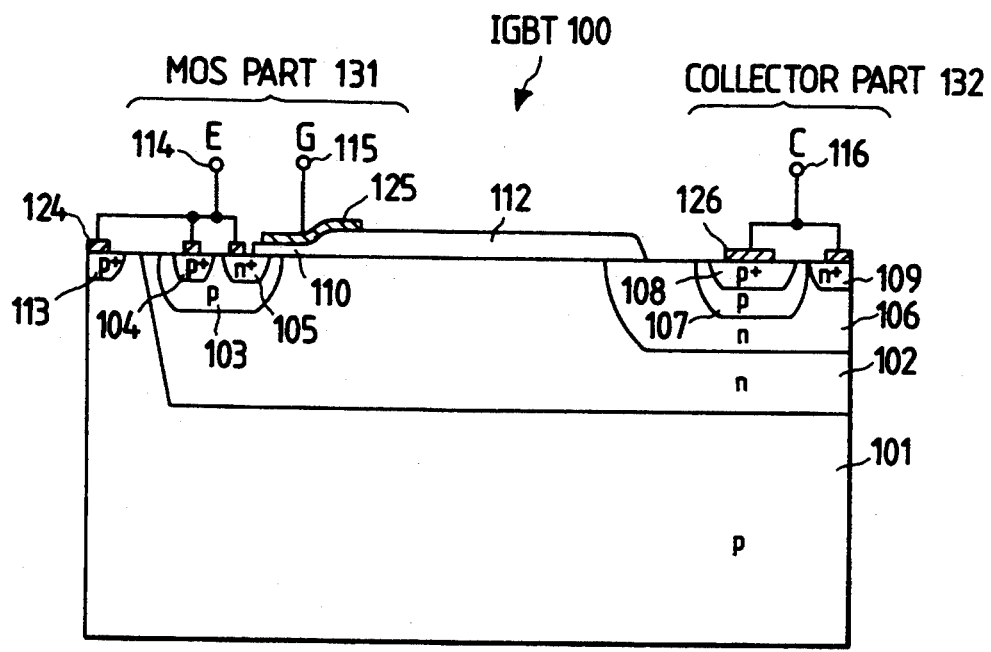
FIG. 1 is a sectional view showing the structure of a high voltage, IGBT according to a first embodiment of the present invention.

FIG. 1 is a sectional view showing the structure of a high voltage MOS transistor according to a first embodiment of the present invention. This high voltage MOS transistor is a lateral IGBT 100 of an npnp structure which includes an n+-type emitter layer 105, a p-type base layer 103, an n-type well layer 102, and a p-type collector layer 107. That is, the IGBT 100 has a high voltage withstanding structure because the wide well layer 102 is secured between the emitter layer 105 and collector layer 107. In the present high voltage IGBT 100, a MOS part 131 is formed in one end portion of the surface of the n-type well layer 102 formed on a p-type semiconductor substrate 101 having a low concentration and a high resistance, while a collector part 132 is formed in the other end portion thereof. In the MOS part 131, there is formed the p-type base layer 103 which provides a channel forming layer and, in the base layer 103, there are further formed the n+-type emitter layer 105 and a p+-type base contact layer 104. Also, on the surface of the semiconductor substrate 101, there is formed a p+-type doping layer 113 which is situated adjacent to the well layer 102 and into which impurities are introduced at a high concentration. In the MOS part 131, on the surfaces of the n+-type emitter layer 105, p-type base layer 103 and n-type well layer 102, there is provided a gate electrode 125 through a gate oxidized film 110. Here, on the surface of the well layer 102 extending between the MOS part 131 and the collector part 132, there is formed a thick field oxidized film 112 which extends integrally from the gate oxidized film 110, and the gate electrode 125 is disposed so as to extend from the gate oxidized film 110 to the field oxidized film 112. Emitter electrodes 124 are respectively connected to the emitter layer 105, base contact layer 104, and doping layer 113. In this manner, in the MOS part 131, the emitter layer 105, and base layer 103 provide a dual diffusion structure and the electric field of the gate electrode 125 on the side of the collector part 132 is relaxed by the field oxidized film 112, thereby improving the withstand voltage of the device.

On the other hand, in the collector part 132 provided in the other end portion of the well layer 102, an n-type base layer 106 is formed on the surface of the well layer 102 and, inside the base layer 106, there are formed a p-type collector layer 107 and an n+-type base contact layer 109. Further, on the surface of the collector layer 107, there is formed a p+-type contact layer 108. Here, collector electrodes 126 are respectively connected to the contact layer 108 and base contact layer 109. In this manner, in the collector part 132 as well, the collector layer 107 and base layer 106 provide a dual diffusion structure, thereby securing the voltage withstanding property of the device. In the IGBT 100, an emitter terminal 114 is connected to the emitter electrodes 124, a gate terminal 115 is connected to the gate electrode 125, and a collector terminal 116 is connected to the collector electrodes 126. Also, a ground potential is supplied to the semiconductor substrate 101 from the back surface side thereof when it is actually mounted.

Here, in the high voltage IGBT 100 according to the present embodiment of the invention, the respective impurity regions such as the well layer 102 provided on the semiconductor substrate 101 are formed by a step of injecting ions from the surface of the semiconductor substrate 101 and by a thermal diffusion step to follow the ion injection step. For example, the well layer 102 is formed by ion injecting P ions as a doner at a voltage of 90 kV from the surface of the semiconductor substrate 101 and then by diffusing the P ions at a temperature of 1100° C. under the oxygen atmosphere. In the high voltage IGBT 100 having such structure, the total ion amounts and diffusion depths of the respective diffusion layers can be controlled with high accuracy, which makes it possible to minimize the variations in withstand voltage, on-voltage, and on-current of the device to thereby improve the device reliability. Further, since there is no need for the formation of a buried layer or for epitaxial growth which are necessary in the prior art, the number of manufacturing steps of the IGBT 100 can be reduced and thus the costs thereof can be reduced 30% or so when compared with the prior art manufacturing method.

Next, the operation of the present high voltage IGBT 100 will be described. At first, when the IGBT 100 is on, in a condition that, with respect to an emitter potential to be applied to the emitter electrode 124, a positive collector voltage is being applied to the collector electrode 126, if a positive potential equal to or greater than a threshold voltage is applied to the gate electrode 125 with respect to the emitter potential, then the surface of the base layer 103 just below the gate electrode 125 is inverted to operate as a channel, so that electrons are allowed to flow from the emitter layer 105 to the well layer 102. The electrons that flowed into the well layer 102 next flow transversely along the well layer 102 to the base contact layer 109, where they are absorbed. In this case, because an electric current from the emitter layer 105 flows through just below the collector layer 107 into the base contact layer 109, positive holes are injected from the collector layer 107 into the well layer 102 due to a voltage drop which occurs just below the collector layer 107. This turns the well layer 102 into a conductivity modulation condition in which the electrons and positive holes exist together. As a result of this, much more electronic currents are allowed to flow and at the same time the positive holes injected from the collector layer 107 are added to the positive hole current components that reach the base layer 103 and semiconductor substrate 101. In this manner, the high voltage IGBT 100 according to the present embodiment of the invention can be operated at a low on voltage and can also drive a high current.

Next, in the off condition, if a zero voltage or a negative voltage with respect to the emitter potential is applied to the gate electrode 125, then the channel formed on the surface of the base layer 103 is caused to disappear and the injection of the electrons from the emitter layer 105 is caused to stop, with the result that the present high voltage IGBT 100 is turned from its conduction state to its blocking state. The minority carriers stored in the well layer 102 and semiconductor substrate 101 are swept out toward the base layer 103 and the p+ type contact layer 104 by the emitter-collector voltage applied by the external power supply, so that the present high voltage IGBT 100 is turned off. In this case, in the pn junction between the well layer 102 and semiconductor substrate 101 and in the pn junction between the well layer 102 and base layer 103, depletion layers are respectively spread according to the applied voltages and thus electric fields are applied. Here, in the present high voltage IGBT 100, since the well layer 102 is formed by means of the ion injection step and the like, the impurity concentration of the semiconductor substrate 101 can be set lower than that of the well layer 102. Thus, in the pn junction between the semiconductor substrate 101 and well layer 102, the depletion layer spreads mainly toward the semiconductor substrate 101 to thereby secure a region in which the depletion layer spreads, so that a device with a high withstand voltage can be realized. Also, since there is eliminated the need that the well layer 102 is formed in a long and low concentration offset layer which is necessary to hold a voltage withstanding in a conventional high voltage MOS transistor, the well layer 102 can be reduced in size to thereby provide a device which is compact and thin in the lateral direction thereof and also the impurity concentration of the well layer 102 can be set at a relatively high level. That is, the high voltage IGBT 100 according to the present embodiment can improve the trade-off between a low on resistance and a high withstand voltage and also can reconcile the low on voltage and high withstand voltage. Also, because the well layer 102 is formed by means of the ion injection and thermal diffusion steps, the impurity distribution in the well layer 102 conforms substantially with a Gaussian distribution, so that the impurity concentration can be made more uniform when compared with a conventional offset layer which is formed by the epitaxial growth. This makes it possible to improve the uniformity of the electric field distribution in the depletion layer spreading from the pn junction between the semiconductor substrate 101 and well layer 102, so that an improved high voltage withstanding structure can be realized. Further, in the present high voltage IGBT 100, because it includes the doping layer 113 formed on the surface of the semiconductor substrate 101 and the base contact layer 109 formed on the surface of the base layer 106, when the IGBT 100 is turned off, the carriers that have flowed into the well layer 102, base layer 106, and semiconductor substrate 101 can be drawn out by means of the doping layer 113 and base contact layer 109, which can reduce the time necessary to sweep out the stored carriers to thereby be able to realize a high speed switching operation.

In this manner, the present high voltage IGBT 100 does not require a substrate with a great thickness but can obtain a sufficient voltage withstanding with a substrate thickness almost equal to that of a substrate for a CMOS and a bipolar transistor forming the control circuit part, so that the present high voltage IGBT 100 can be formed on the same substrate as the low voltage control circuit part.

Figure 2:
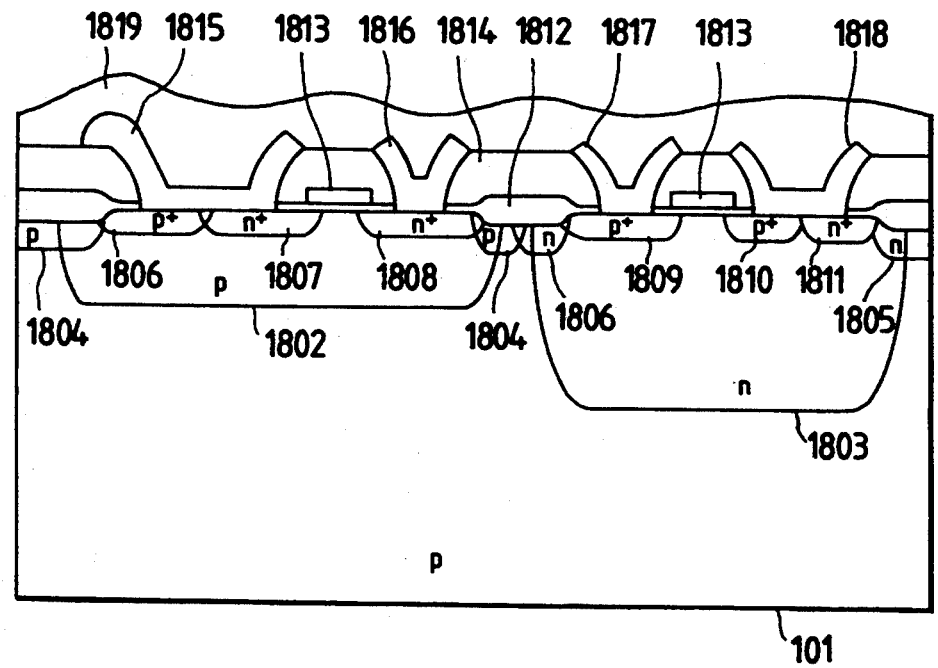
FIG. 2 is a sectional view showing the structure of a CMOS which is integrated with a high voltage MOS transistor according to the present invention.

FIG. 2 is a sectional view showing a low voltage control circuit part which can be formed on the same substrate as the above-mentioned high voltage IGBT 100. In FIG. 2, on the surface of a p-type semiconductor substrate 101, a low voltage control circuit part is formed by means of a CMOS which consists of an n-channel type MOS formed in a p-type well 1802 and a p-channel type MOS formed in an n-type well 1803. In this low voltage control circuit part, the n-type well 1803 can be formed by the same step as the n-type well layer 102 of the high voltage IGBT 100 shown in FIG. 1 and also a p-type field layer 1804 and n-type field layer 1805 can be formed by the same steps as the p-type base layer 103 and n-type base layer 106 of the same high voltage IGBT 100. Of course, the source and drain layers of this low voltage control circuit part can also be formed in the same steps as the emitter and collector layers of the same high voltage IGBT 100. In this manner, in the semiconductor integrated circuit device formed into one chip by use of the high voltage IGBT 100 of the invention, an impurity region for high voltage withstanding and an impurity region for the low voltage control circuit part can be formed simultaneously, which makes it possible to reduce the chip manufacturing steps.

Here, as the low voltage control circuit part which can be combined with the high voltage IGBT 100 of the invention into one chip, besides the CMOS, of course a bipolar transistor or a BiCMOS can also be used.

[Embodiment 2]

Figure 3:
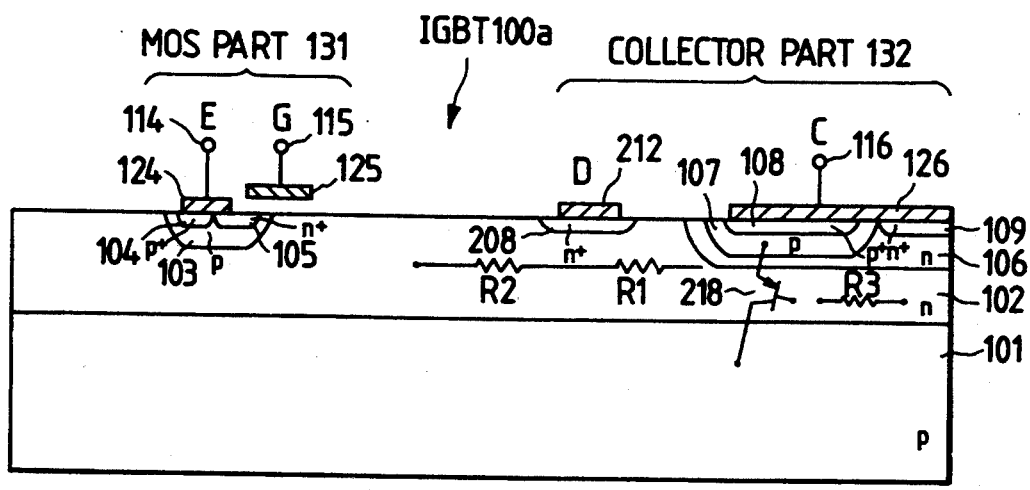
FIG. 3 is a sectional view showing the structure of a high voltage IGBT according to a second embodiment of the present invention.

FIG. 3 is a sectional view showing the structure of a high voltage IGBT 100a according to a second embodiment of the present invention. In the high voltage IGBT 100a shown in FIG. 3, parts corresponding to those of the high voltage IGBT 100 shown in FIG. 1 are given the same designations and the description thereof is omitted here.

The high voltage IGBT 100a is different from the high voltage IGBT 100 according to the embodiment 1 in that, on the surface of a well layer 102 in the neighborhood of a collector part 132, there is formed an $n^+$-type drain layer 208. To the drain layer 208, there is connected a drain electrode 212 which in turn connects the high voltage IGBT 100a to an external element provided in the same chip.

Figure 4:
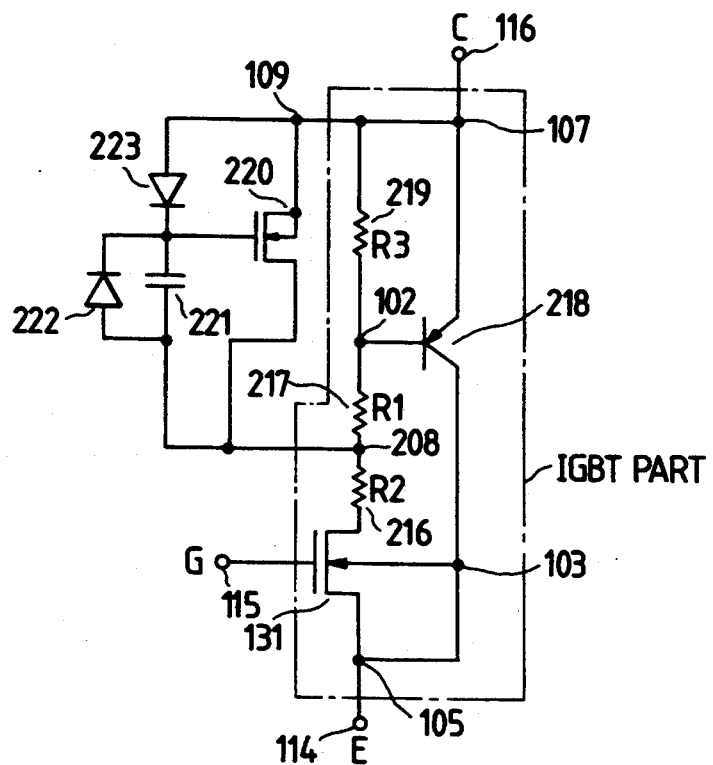
FIG. 4 is a circuit diagram showing an equivalent circuit in which the high voltage IGBT in FIG. 2 is shown together with external elements.

FIG. 4 is a circuit diagram showing an equivalent circuit in which the high voltage IGBT 100a is shown together with external elements. In FIG. 4, the external elements are an n-channel type MOSFET 220, a capacitor 221, and first and second diodes 222, 223 and the external elements are assembled to be able to connect the drain layer 208 to a collector terminal 116 in a short-circuit manner. In the external elements, the MOSFET 220 is interposed between the drain layer 208 and collector terminal 116 such that the source is connected to the collector terminal 116, while the capacitor 221 is connected between the gate and drain of the MOSFET 220. The first diode 222 to prevent the insulation destruction of the capacitor 221 is disposed in parallel to the capacitor 221 such that the cathode thereof is connected to the gate of the MOSFET 220. Also, the second diode 223 is interposed between the gate and source of the MOSFET 220 such that the cathode thereof is connected to the gate of the MOSFET 220.

Next, the operation of the high voltage IGBT 100a connected to the external elements constructed in the above-mentioned manner will be described. The operation of the high voltage IGBT 100a in the on state thereof is substantially similar to that of the high voltage IGBT 100 according to the first embodiment of the invention and thus the description thereof is omitted here. The high voltage IGBT 100a is characterized in that, when the device is turned off from its on state, by turning on the MOSFET 220 in the external elements, minority carriers in the well layer 102, that is, positive holes are drawn out fast from the drain layer 208 to thereby be able to realize the high speed switching of the device. In other words, the on voltage of the high voltage IGBT 100a according to the second embodiment is about 10 V, and the main current thereof flows from the collector terminal 116 (collector layer 107) through parasitic resistances 219, 217 and 216 respectively provided in the well layer 102 and then through the channel of the MOSFET 131 and reaches the emitter layer 105 (emitter terminal 114). As a result of this, a voltage obtained by subtracting the forward voltage of the second diode 223 from a voltage equal to the voltage drops of the parasitic resistances 219 and 217 is applied to and stored in the capacitor 221 (about 5 V). From this state, when the element is turned off, if the MOSFET 131 is turned off, then the potential of the drain layer 208 is raised up to be equal to the collector potential. As a result of this, due to the electric charges of the capacitor 221 which have been prevented from flowing by the first and second diodes 222 and 223, the gate potential of the MOSFET 220 rises higher than the collector potential serving as the source, so that the MOSFET 220 is caused to turn on. Responsive to this, in the high voltage IGBT 100a, the drain layer 208 and collector layer 107 (collector terminal 116) are connected to each other in a short-circuit manner, so that the minority carriers in the well layer 102 are allowed to flow out rapidly through the drain layer 208 toward the collector terminal 116. That is, according to the second embodiment of the present invention, it is possible to reduce to a great extent the time necessary to sweep out the stored carriers, which can realize the high speed switching of the device.

As mentioned above, the high voltage IGBT 100a according to the second embodiment of the present invention is characterized in that the drain layer 208 is disposed on the surface of the well layer 102 adjacent to the collector part 132 (the position of the drain layer 208 depends upon a ratio between the parasitic resistances 216 and 217 in the well layer 102), and that the drain layer 208 is connected to the collector terminal 116 by the external elements in a short-circuit manner. Therefore, when the device is turned off, the minority carriers in the well layer 102 can be made to disappear rapidly, so that the high speed device switching can be realized. Here, in the external elements, a gate signal to control the MOSFET 220, which is interposed between the drain layer 208 and collector terminal 116 to connect them to each other in a short circuit manner, depends on the electric charges of the capacitor 221 which is formed by combining a plurality of elements into a unit. This eliminates the need for provision of terminals to control the external elements, so that the device can be designed easily and thus wiring can also be simplified.

Figure 5:
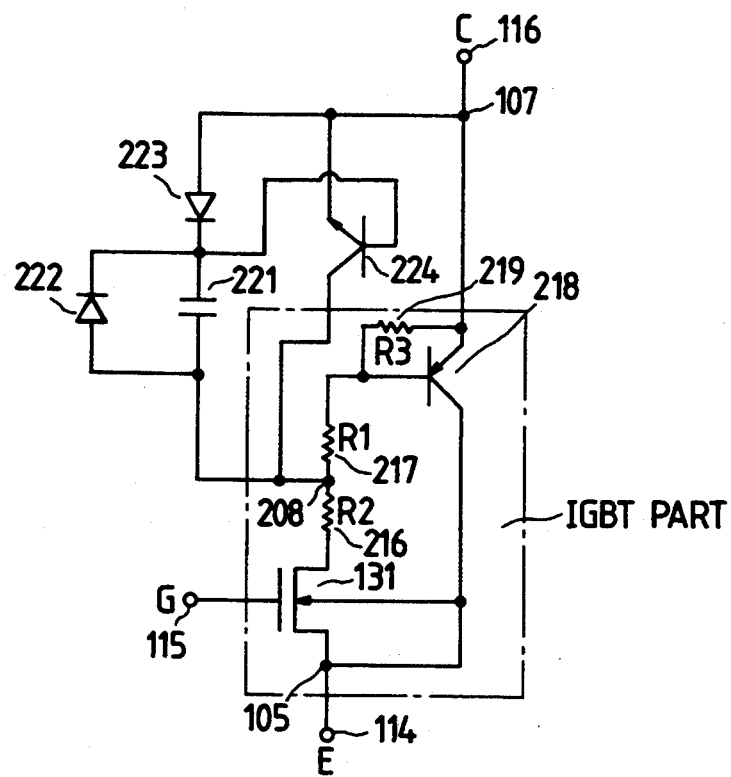
FIG. 5 is a circuit diagram showing an equivalent circuit in which the high voltage IGBT in FIG. 2 is shown together with external elements.

In the external elements in this embodiment, it is possible to connect the drain layer 208 to the collector terminal 116 by a bipolar transistor instead of the MOSFET 220, and FIG. 5 shows an equivalent circuit of the modification. In FIG. 5, an npn transistor 224 is disposed between the drain layer 208 and the collector terminal 116 such that the emitter of the transistor 224 is connected to the collector terminal 116. Thus, when the element is turned off, electric charges released from the capacitor 221 become a base current of the transistor 224 and the transistor 224 shifts into a saturation state, so that the drain layer 208 is connected to the collector terminal 116 in a short-circuit manner. Thus, similar effects to those of the circuit shown in FIG. 4 can be obtained.

[Embodiment 3]

Figure 6:
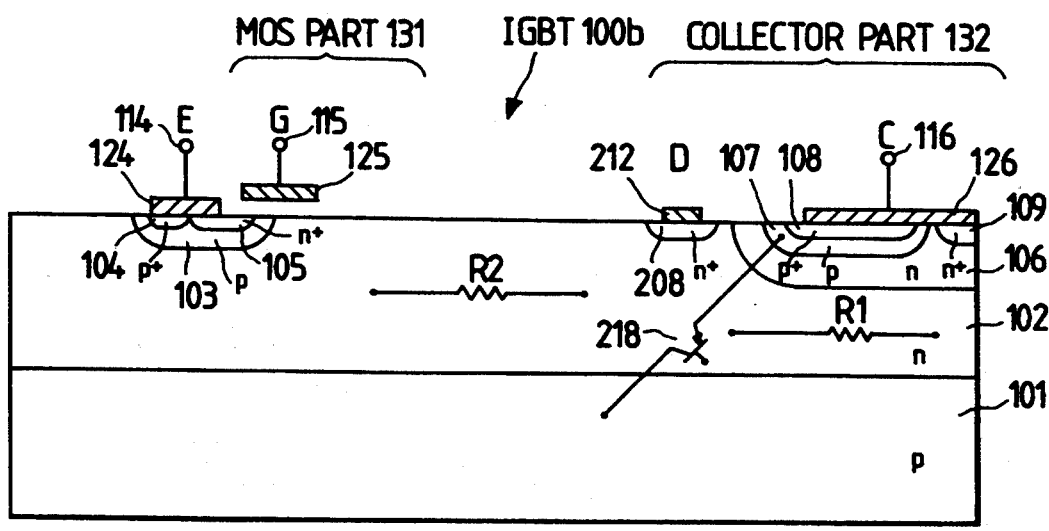
FIG. 6 is a sectional view showing the structure of a high voltage IGBT according to a third embodiment of the present invention.

FIG. 6 shows a sectional view showing the structure of a high voltage IGBT 100b according to a third embodiment of the present invention. In the high voltage IGBT 100b shown in FIG. 6, parts corresponding to those of the high voltage IGBT 100a shown in FIG. 3 are given the same designations and thus the description thereof is omitted here. The high voltage IGBT 100b is different from the high voltage IGBT 100a according to the second embodiment in that an n+-type drain layer 208 is formed adjacent to the base layer 106 of the collector part 132. In this high voltage IGBT 100b as well, a drain electrode 212 is connected to the drain layer 208 and thus the drain layer 208 is connected to external elements which are provided in the same chip.

Figure 7:
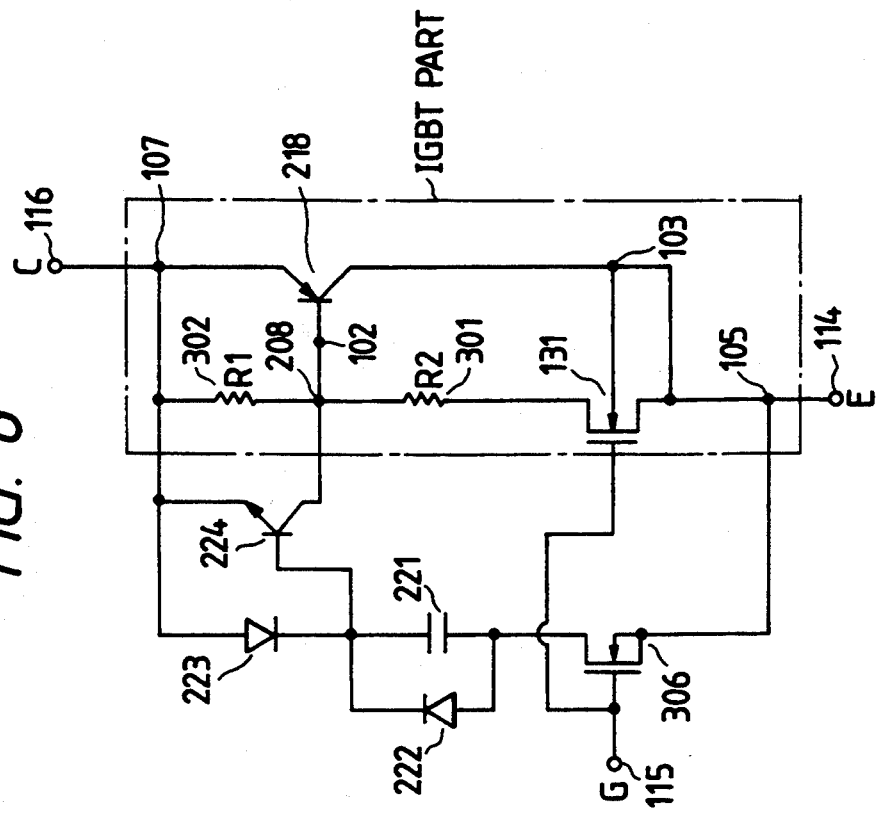
FIG. 7 is a circuit diagram showing an equivalent circuit in which the high voltage IGBT in FIG. 6 is shown together with external elements;.

Now, FIG. 7 is a circuit diagram of an equivalent circuit in which the high voltage IGBT 100b according to the third embodiment is shown together with external elements. In the equivalent circuit shown in FIG. 7, parts similar to those of the equivalent circuits respectively shown in FIGS. 4 and 5 are given the same designations. In FIG. 7, the third embodiment is characterized by the structures of the external elements. In particular, the third embodiment is characterized in that, in addition to the n-channel type MOSFET 220, capacitor 221, and first and second diodes 222, 223, it includes a second n-channel type MOSFET 306 to be controlled by the same gate signal as the high voltage IGBT 100b. The second MOSFET 306 is interposed between emitter terminal 114 and capacitor 221 such that the source thereof is connected to the emitter terminal 114. Also, the gate of the second MOSFET 306 is connected to the gate electrode 125 by means of a metal wire such that the same signal as the gate signal of the high voltage IGBT 100b is applied.

Similarly to the high voltage IGBT 100a according to the second embodiment, in the high voltage IGBT 100b according the third embodiment, when the device is turned off, the minority carriers in the well layer 102 can be drawn out rapidly from the drain layer 208 to thereby realize the high speed switching of the device. That is, in the present high voltage IGBT 100b, if a voltage equal to or greater than a threshold value is applied to the gate terminal 115, then not only the MOSFET 131 disposed on the side of the present high voltage IGBT 100b but also the second MOSFET 306 are turned on, so that a voltage obtained by subtracting the forward voltage of the second diode 223 from the on voltage of the high voltage IGBT 100b is applied across the capacitor 221. For this reason, when the device is turned off, if a zero potential or a negative potential with respect to the emitter potential is applied to the gate terminal 115, then the second MOSFET 306 is turned off and the drain of the second MOSFET 306 becomes equal to the collector potential, so that the MOSFET 220 is turned on due to the electric charges of the capacitor 221. Thus, the drain layer 208 is connected to the collector layer 107 (collector terminal 116) in a short-circuit manner, whereby the minority carriers in the well layer 102 can be made to disappear rapidly, and thus the high speed switching of the device can be realized.

Figure 8:
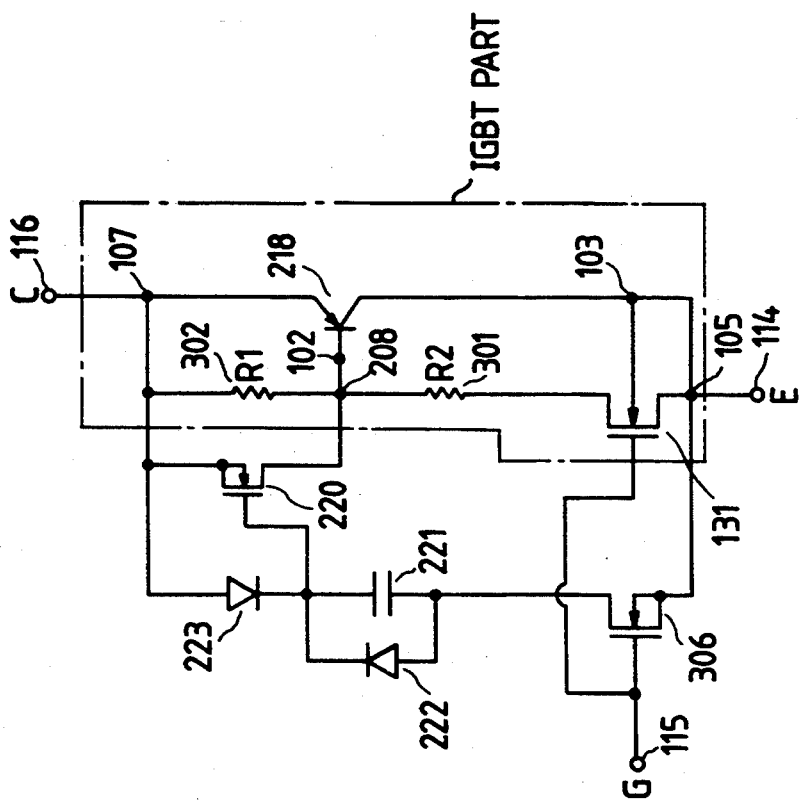
FIG. 8 is a circuit diagram showing an equivalent circuit in which the high voltage IGBT in FIG. 6 is shown together with external elements.

Similarly to the second embodiment, in the external elements according to the third embodiment, the drain layer 208 can be connected to the collector terminal 116 by a bipolar transistor not by the MOSFET 220, and an equivalent circuit in this modification is shown in FIG. 8. In FIG. 8, an npn transistor 224 is interposed between the drain layer 208 and collector terminal 116 such that the emitter thereof is connected to the collector terminal 116. When the element is turned off, the drain layer 208 and collector terminal 116 can be connected to each other in a short-circuit manner, whereby there can be obtained a similar effect to the circuit shown in FIG. 7.

[Embodiment 4]

FIG. 9 (a) is a plan view of the structure of a high voltage IGBT 100c according to a fourth embodiment of the present invention, while FIG. 9 (b) is a sectional view thereof. In FIG. 9 (b), parts similar to those of the high voltage IGBT 100a shown in FIG. 3 are given the same designations, and thus the description thereof is omitted here. The high voltage IGBT 100c is different from the high voltage IGBT 100a in accordance with the second embodiment in that the external elements in the second embodiment are disposed in the well layer 102. In other words, a MOS part 131 is formed in one end portion of the surface of the well layer 102 formed on the semiconductor substrate 101 and an emitter electrode 124 and a gate electrode 125 are provided in the MOS part 131. On the other hand, on the other end portion thereof, there is formed an n-type base layer 106 and, within the base layer 106, a collector layer 107 and a well layer 401 are formed by means of two p-type wells, respectively. Further, within the collector layer 107, there are formed a p+-type contact layer 108 and an n+-type source layer 404 and, within the well layer 401 as well, there are formed similarly a p+-type contact layer 407 and an n+-type contact layer 408. There is formed an n+-type base contact layer 109 between the collector layer 107 and well layer 401. In the high voltage IGBT 100c, on the surfaces of the n+-type source layer 404, p-type collector layer 107, and n-type base layer 106, there is provided a second gate electrode 409 through a gate oxidized film 111 which extends integrally from a field oxidized film 112. The second gate electrode 409 is disposed so as to extend over the gate oxidized film 111 and field oxidized film 112. Also, to the surfaces of the n+-type source layer 404, p+-type contact layer 108, collector layer 107, base layer 106, base contact layer 109, well layer 401, and p+-type contact layer 407, there is connected a collector electrode 126. Further, the n+-type contact layer 408 is connected to the second gate electrode 409 by means of a metal wire 414, and a field plate 413 is also connected to the second electrode 409.

Figure 10:
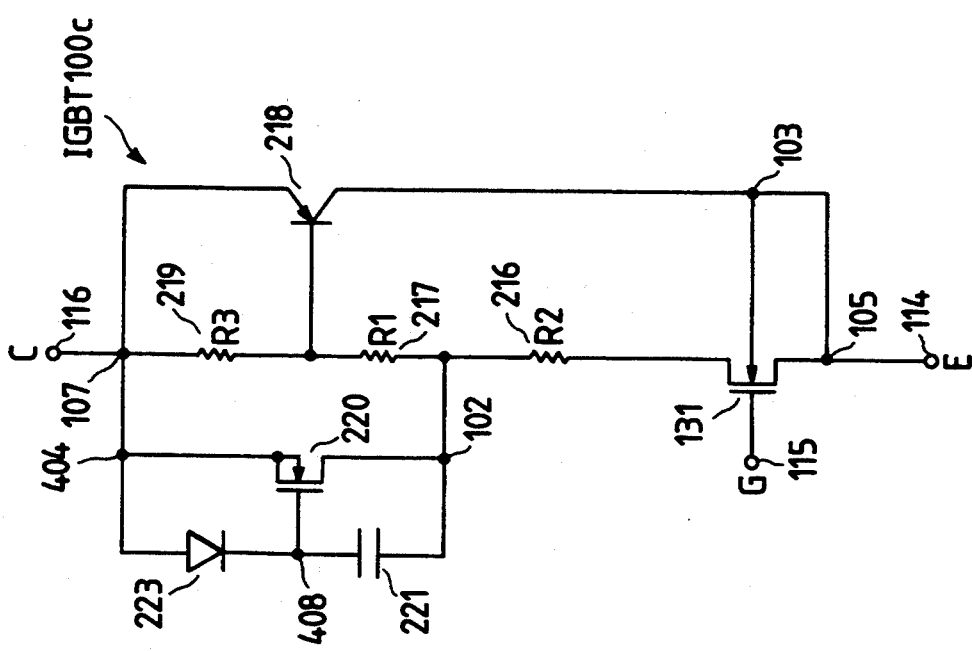
FIG. 10 is a circuit diagram showing an equivalent circuit of the high voltage IGBT shown in FIGS. 9 (a) and 9 (b)

Due to the fact that the present high voltage IGBT 100c has the above-mentioned structure, as shown in FIG. 10, there can be obtained a circuit which is substantially similar to the equivalent circuit according to the second embodiment shown in FIG. 4. In the equivalent circuit shown in FIG. 10, although there is not provided a protective diode for protection of the capacitor 221 (the first diode 222 shown in FIG. 4), the insulation destruction of the oxidized film will never occur in operation. In the equivalent circuit shown in FIG. 10, parts similar to those of the equivalent circuit shown in FIG. 4 are given the same designations In FIGS. 9 (a), 9 (b) and 10 the n+-type source layer 404 communicates with the well layer 102 (base layer 106) by means of a channel which is formed on the surface of the collector layer 107 just below the second gate electrode 409 thereby providing an n-channel type MOSFET 220. Also, a parasitic capacitor 410 formed between the second gate electrode 409 and well layer 102 through the field oxidized film 112 and a parasitic capacitor 411 formed between the field plate 413 and well layer 102 through the inter-layer insulation film 113 cooperate in forming the capacitor 221, and the pn junction between the p-type well layer 401 and n+-type contact layer 408 cooperate in forming the diode 223.

As described above, in the high voltage IGBT 100c, within the base layer, the MOSFET 220 and diode 223 are structurally formed and, at the same time, the capacitor 221 is interposed between the gate electrode 409 of the MOSFET 220 and the well layer 102 and between the field plate 413 connected to the gate electrode 409 and the well layer 102, whereby there can be realized a similar circuit to the circuit according to the second embodiment equivalently shown in FIG. 4. Therefore, this high voltage IGBT 100c can provide a similar effect to the second embodiment and, when the device is turned off, can realize the high speed switching of the device. Also, it is not necessary to provide an element isolation region and the well layer 102 can serve as the well layer of the MOSFET 220 and also as a capacitor forming part, so that the area of the device can be reduced. Due to the fact that, by connecting the collector electrode 126 in such a manner that it extends over the surfaces of the n+-type source layer 404, p+-type contact layer 108, collector layer 107, base layer 106, base contact layer 109, well layer 401 and the p+-type contact layer 407, there is eliminated the need to provide a high voltage wire among the collector of the high voltage IGBT 100c, the source of the MOSFET 220 and the anode of the diode 223. It is thus possible to prevent the lowering of withstand voltage due to the high voltage wiring in integrating the high voltage IGBT and switching element into one chip and thus it is also possible to realize improved reliability of the integrated circuit device.

[Embodiment 5]

Figure 11:
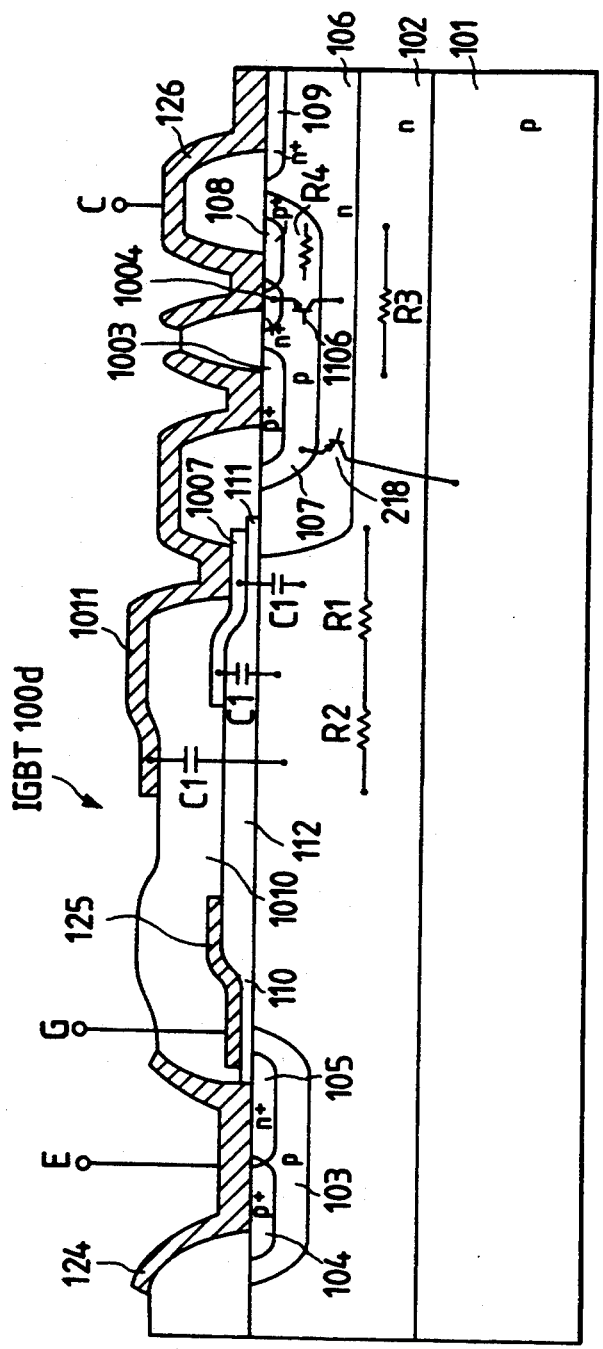
FIG. 11 is a sectional view showing the structure of a high voltage IGBT according to a fifth embodiment of the present invention.

FIG. 11 is a sectional view showing the structure of a high voltage IGBT 100d constructed according to a fifth embodiment of the present invention. In the high voltage IGBT 100d shown in FIG. 11, parts similar to those of the high voltage IGBT 100c shown in FIG. 9 are given the same designations and thus the description thereof is omitted here. In FIG. 11, this high voltage IGBT 100d, similarly to the high voltage IGBT 100c according to the fourth embodiment shown in FIGS. 9 (a) and (b) is characterized in that the external elements employed in the second embodiment are formed in the well layer 102. That is, in one end portion of the surface of the well layer 102 formed on the semiconductor substrate 101, there is formed a MOS part 131 in which there are provided an emitter electrode 124 and a gate electrode 125. On the other hand, in the other end portion of the surface, there is formed an n-type base layer 106 in which there are provided a p-type collector layer 107 and an n+-type base contact layer 109. Within the collector layer 107, there are formed a p+-type contact layer 108 and an n+-type emitter layer 1004 in such a manner that the respective end portions thereof are overlapped on each other, and there is further provided a p+-type contact layer 1003. In the high voltage IGBT 100d, on the surfaces of the n-type base layer 106 and well layer 102, there is provided a capacitor electrode 1007 through a gate oxidized film 111 extending integrally from a field oxidized film 112, and the capacitor electrode 1007 is disposed in such a manner that it extends over from the gate oxidized film 111 to the field oxidized film 112. Also, to the surfaces of the n+-type emitter layer 1004, p+-type contact layer 108 and n+-type contact layer 109, there is connected a collector electrode 126. The p+-type contact layer 1003 is connected to the capacitor electrode 1007 by means of a metal wire 1011, while the metal wire 1011 extends through an inter-layer insulation film 1010 widely up to the upper portion of the well layer 102.

Figure 12:
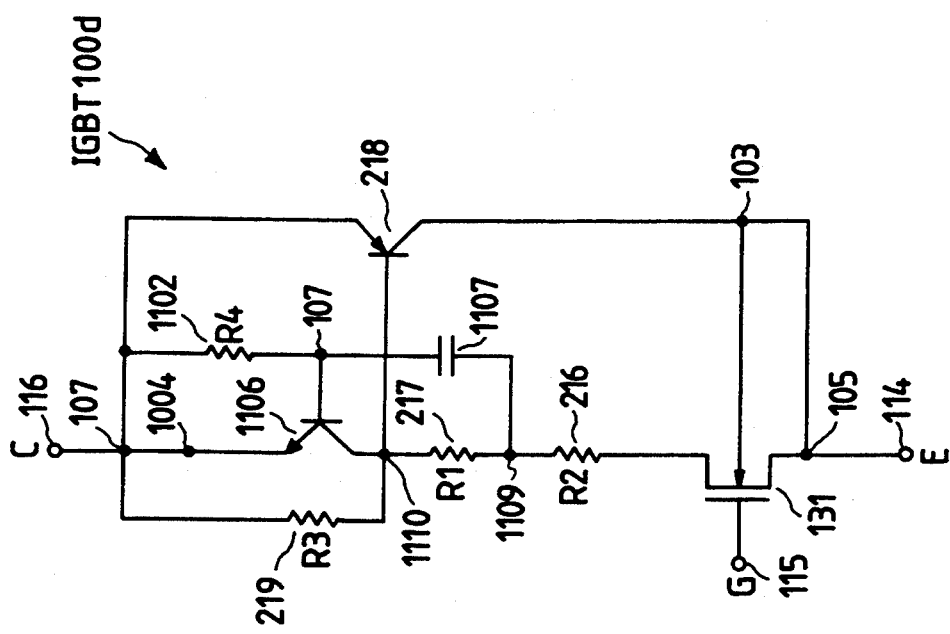
FIG. 12 is a circuit diagram showing an equivalent circuit of the high voltage IGBT shown in FIG. 11.

FIG. 12 shows an equivalent circuit of the high voltage IGBT 100d. In FIG. 12, an npn-type transistor 1106, which is used to draw out minority carriers in the well layer 102 when the high voltage IGBT 100d is turned off, consists of the n+-type emitter layer 1004, collector layer 107 and well layer 102 (base layer 106). The capacitor 1107 consists of three parasitic capacitors, that is, a first parasitic capacitor formed between the capacitor electrode 1007 and well layer 102 through the gate oxidized film 111, a second parasitic capacitor formed between the capacitor electrode 1007 and well layer 102 through the field oxidized film 112, and a third parasitic capacitor formed between the metal wire 1011 and well layer 102 through the inter-layer insulation film 1010.

In the high voltage IGBT 100d having the above-mentioned structure, when it is turned on, a main current flows from the collector terminal 116 (collector layer 107) through the parasitic resistances 219, 217 and 216 and the channel of the MOSFET 131 to the emitter layer 105 (emitter terminal 114). As a result of this, a voltage, which is obtained by subtracting a voltage produced in a parasitic resistance 1102 from a voltage produced in the parasitic resistances 219, 217, is applied to the capacitor 1107. When the element is turned off from this state, if the MOSFET 131 is turned off, then the potential of a node 1109 becomes equal to the collector potential and, for this reason, the electric charges that are released from the capacitor 1107 provide the base current of the transistor 1106, so that the transistor 1106 is turned into its saturation state. Accordingly, a node 1110 is connected to the collector terminal 116 in a short-circuit manner to thereby cause the minority carriers in the well layer 102 to be flown out quickly toward the collector terminal 116. This makes it possible to reduce greatly a time necessary to sweep out the stored carriers, which leads to the high speed switching of the device. Also, in the high voltage IGBT 100d, due to the fact that the transistor 1106 and capacitor 1107 are structurally formed in the well layer 102 and also there is eliminated the need to provide the high voltage wiring, similarly to the high voltage IGBT 100c according to the fourth embodiment of the invention, a compact structure and a high reliability can be realized simultaneously when it is constructed as one chip.

[Embodiment 6]

Figure 13:
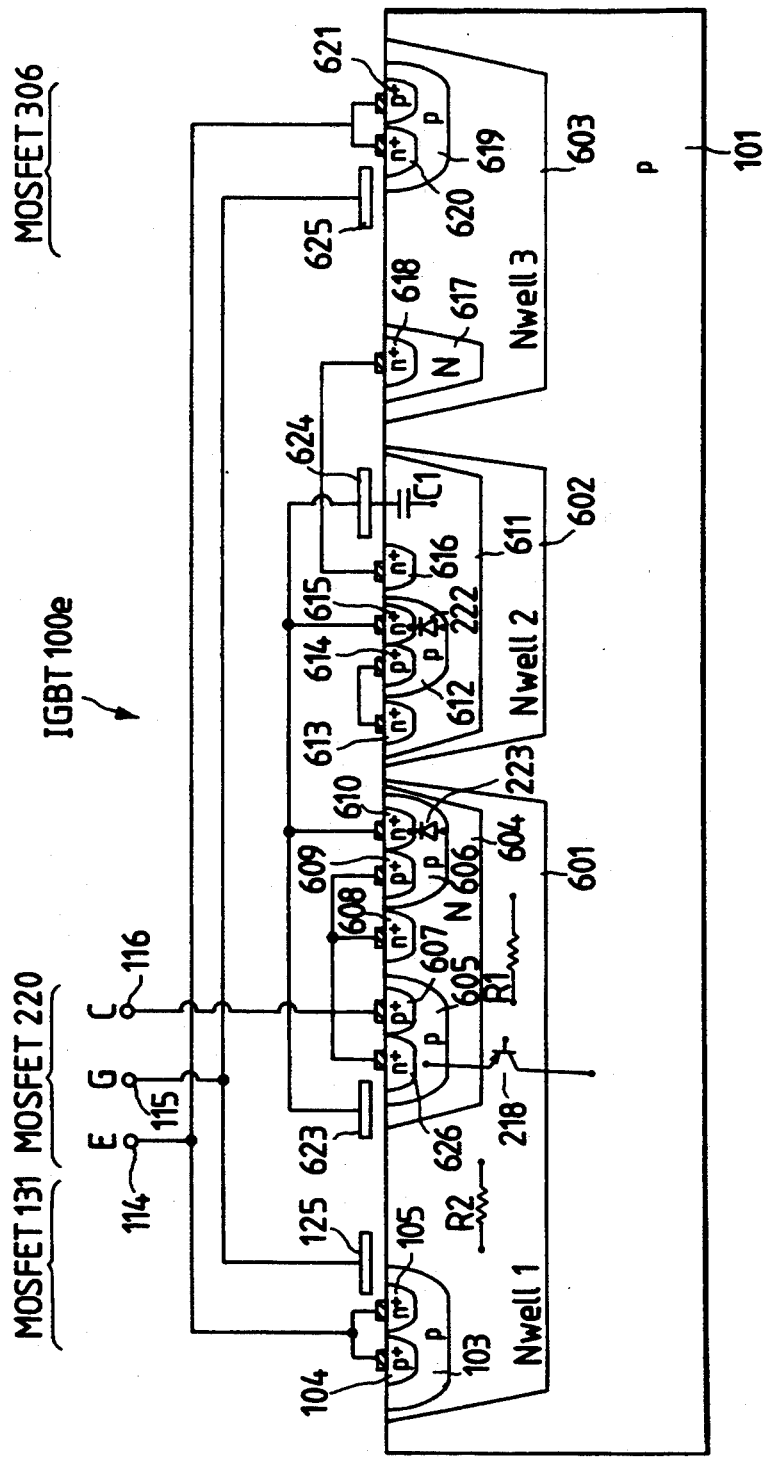
FIG. 13 is a sectional view showing the structure of a high voltage IGBT according to a sixth embodiment of the present invention.
Figure 14:
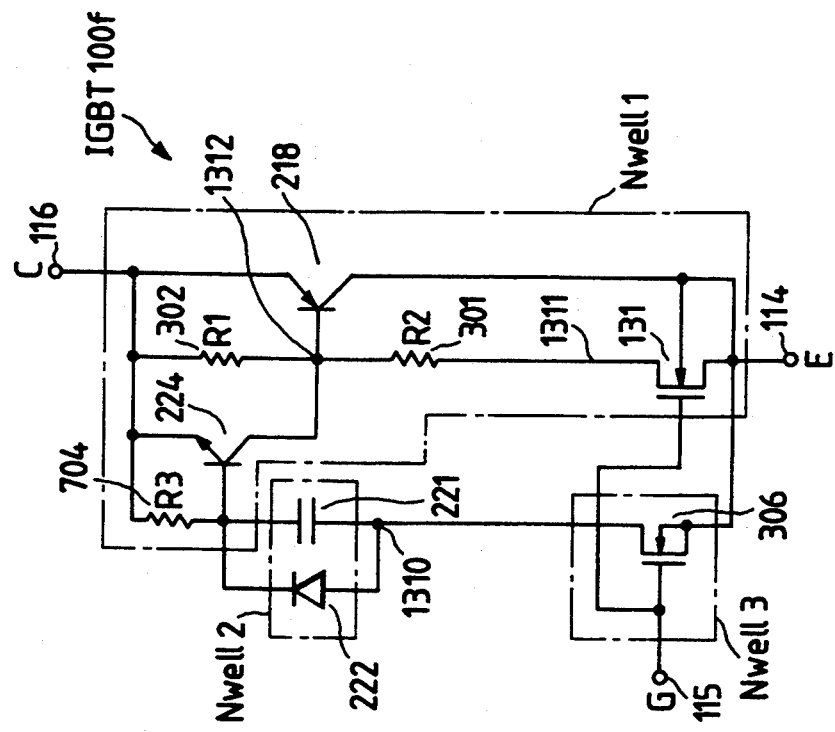
FIG. 14 is a circuit diagram showing an equivalent circuit of the high voltage IGBT shown in FIG. 13.

FIG. 13 is a sectional view showing the structure of a high voltage IGBT 100e constructed according to a sixth embodiment of the present invention, and FIG. 14 is a circuit diagram showing an equivalent circuit thereof. In the high voltage IGBT 100e of this embodiment, the equivalent circuit thereof is the same as the MOS-equivalent circuit according to the third embodiment shown in FIG. 7. The high voltage IGBT 100e is characterized in that the equivalent circuit is obtained equivalently from three n-type wells respectively formed on the surface side of a semiconductor substrate 101. That is, in a first well layer 601 out of the three n-type wells formed on the surface side of the semiconductor substrate 101, there is formed an IGBT which provides a main passage for current driving. In one end portion of the well layer 601, there is formed a MOS part 131, while in an n-type base layer 604 formed in the other end portion thereof there are formed a p-type collector layer 605 and a p-type base layer 606. Further, in the collector layer 605, there are formed a p+-type contact layer 607 and an n+-type source layer 626, while in the base layer 606 there are formed a p+-type base contact layer 609 and an n+-type contact layer 610. And, an n+-type base contact layer 608 is formed between the collector layer 605 and base layer 606.

On the other hand, in a second well layer 602, there are provided a capacitor 221 serving as a drive source of the channel-type MOSFET 220 structurally formed in the first well layer 601, and a diode 222 which is used to protect the capacitor 221. That is, in an n-type base layer 611 formed within the well layer 602, there are formed a p-type base layer 612 and two n+-type base contact layers 613, 616. Further, in the base layer 612, there are formed a p+-type base contact layer 614 and an n+-type contact layer 615. Here, since a capacitor electrode 624 to be provided on the surface of the base layer 611 is provided through a thin film of several hundred Å equivalent to the gate oxidized film, the capacitor area can be reduced.

Also,, in a third well layer 603, there is formed a high voltage n-channel type MOSFET 306 whose withstand voltage is the same as the IGBT formed in the first well layer 601. That is, in the well layer 603, there are formed an n-type base layer 617 and p-type base layer 619. Further, in the n-type base layer 617, there is formed an n+-type base contact layer 618, while in the p-type base layer 619 there are formed a p+-type base contact layer 621 and an n+-type source layer 620.

In the respective semiconductor regions formed in the well layers, on the surfaces of the emitter layer 105, base layer 103 and well layer 601, there provided a firs gate electrode 125 and, on the surfaces of the source layer 620, base layer 619 and well layer 603, there is provided a second gate electrode 625. These gate electrodes 125, 625 are connected to the gate terminal 115. Also, on the surfaces of the source layer 626, base layer 605, base layer 604 and well layer 601, there is provided a third electrode 623 and, on the surface of the base layer 611, there is formed a capacitor electrode 624. These electrodes are connected to the contact layer 610 and contact layer 615. Also, the base contact layer 104, emitter layer 105, base contact layer 621 and source layer 620 are respectively connected to the emitter terminal 114 by the metal wiring. The source layer 626, contact layer 607, base contact layer 608 and base contact layer 609 are respectively connected to the collector terminal 116. The base contact layer 613 is short-circuited to the base contact layer 614, and also the base contact layer 616 is short-circuited to the base contact layer 618.

As described above, in the high voltage IGBT 100e, due to the fact that the three well layers 601, 602 and 603 are formed adjacent to each other on the surface side of the semiconductor substrate 101 and the MOSFET 220, 223, capacitor 221 and diodes 222, 223 are structurally formed in these well layers, there can be equivalently realized a circuit similar to the circuit according to the third embodiment shown in FIG. 7. Therefore, there can be provided a similar effect to the third embodiment and thus, when the device is turned off, a high speed switching operation can be realized. Also, because only the potential difference of about 10 V is produced between the respective wells, the wells can be formed adjacent to each other at such intervals that they are not in contact with each other, with the result that the device area can be reduced. Because elements formed in the second and third well layers 602 and 603 are for driving the MOSFET 220 formed in the first well layer 601, the element area of the second and third well layers 602, 603 can be made smaller than the element area of the first well layer 601 (about 1/10). For this reason, in enhancing the device switching characteristic, even if a circuit composed of the second and third well layers 602 and 603 is added, the whole area will not be increased to a great extent. Further, since the high voltage IGBT 100e has three output terminals similarly to a single IGBT, the design of the device is easy and the wiring can also be simplified.

[Embodiment 7]

Figure 16:
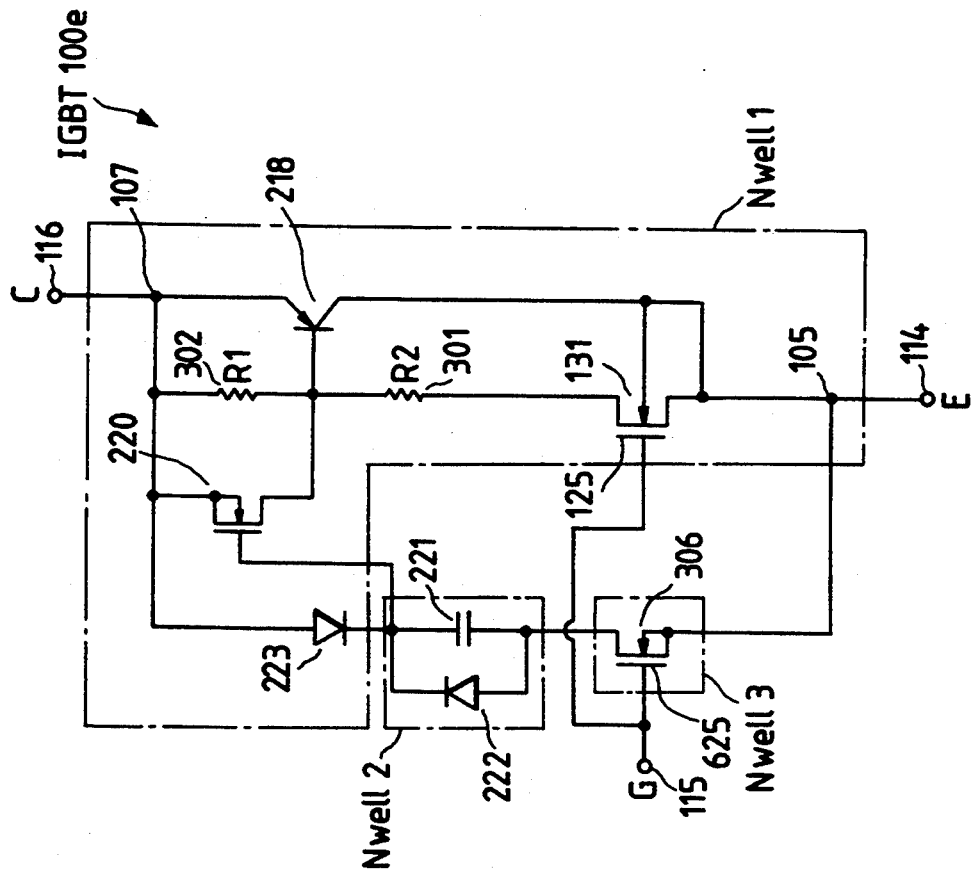
FIG. 16 is a circuit diagram showing an equivalent circuit of the high voltage IGBT shown in FIG. 15.

FIG. 15 is a sectional view showing the structure of a high voltage IGBT 100f according to a seventh embodiment of the present invention, and FIG. 16 is an equivalent circuit thereof. In the high voltage IGBT 100f shown in FIG. 15, parts similar to those of the high voltage IGBT 100e shown in FIG. 13 are given the same designations and thus the description thereof is omitted here. The high voltage IGBT 100f is different from the high voltage IGBT 100e in that a switching element used to draw out minority carriers generated in the first well layer 601 is formed as an npn transistor 224. That is, in the high voltage IGBT 100f, in an n-type base layer 604 which is formed in the other end portion of the first well layer 601, there are formed a p-type collector layer 605 and an n+-type base contact layer 608. In the collector layer 605, there are formed two p+-type contact layers 1207, 1209 and an n+-type emitter layer 1208. The emitter layer 1208, collector layer 605 and well layer 601 cooperate in forming the npn transistor 224.

As described above, in the high voltage IGBT 100f of this embodiment, when the element is turned on, a voltage, which is obtained by subtracting the voltage drop of a parasitic resistance 704 from the on voltage of the high voltage IGBT 100f, is applied across a capacitor 221. And, if the device is changed into its off state, then MOSFETS 131 and 306 turn off and thus nodes 1310 and 1312 become equal to the collector potential, with the result that electric charges stored in the capacitor 221 become the base current of the npn transistor 224 and the transistor 224 is turned on. Thus, the transistor 224 becomes saturated and is now able to connect the node 1312 to the collector terminal 116 in a short circuit manner, so that a high speed switching operation can be realized. Also, in the high voltage IGBT 100f as well, a potential difference between the respective wells is about 10 V and, therefore, similarly to the high voltage IGBT 100e according to the sixth embodiment of the invention, the device characteristic can be enhanced without increasing the device area to a great extent. Further, in the combined device according to the present embodiment, the current amplification rate (h$_{fe}$) of the transistor 224 can be set in the range of about 10 to 50, so that the electric charges to be stored in the capacitor 221 may be 1/h$_{fe}$ of the total amount of minority carriers to be stored in the well layer 102. For this reason, there is eliminated the need for a large capacitor area, which makes it possible to reduce the area to be occupied by the second and third well layers 602 and 603. That is, the combined device can be reduced in size.

[Embodiment 8]

Next, in a high voltage output element such as the above-mentioned high voltage IGBTs and the like, a method of extracting and a high voltage output will be described.

Figure 17A:
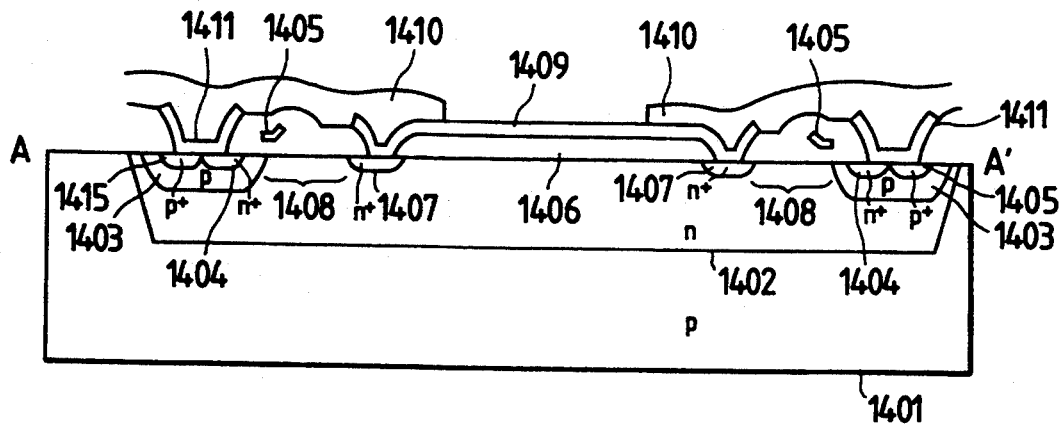
FIG. 17 (a) is a sectional view showing the structure of a high voltage MOSFET according to an eighth embodiment of the present invention.
Figure 17B:
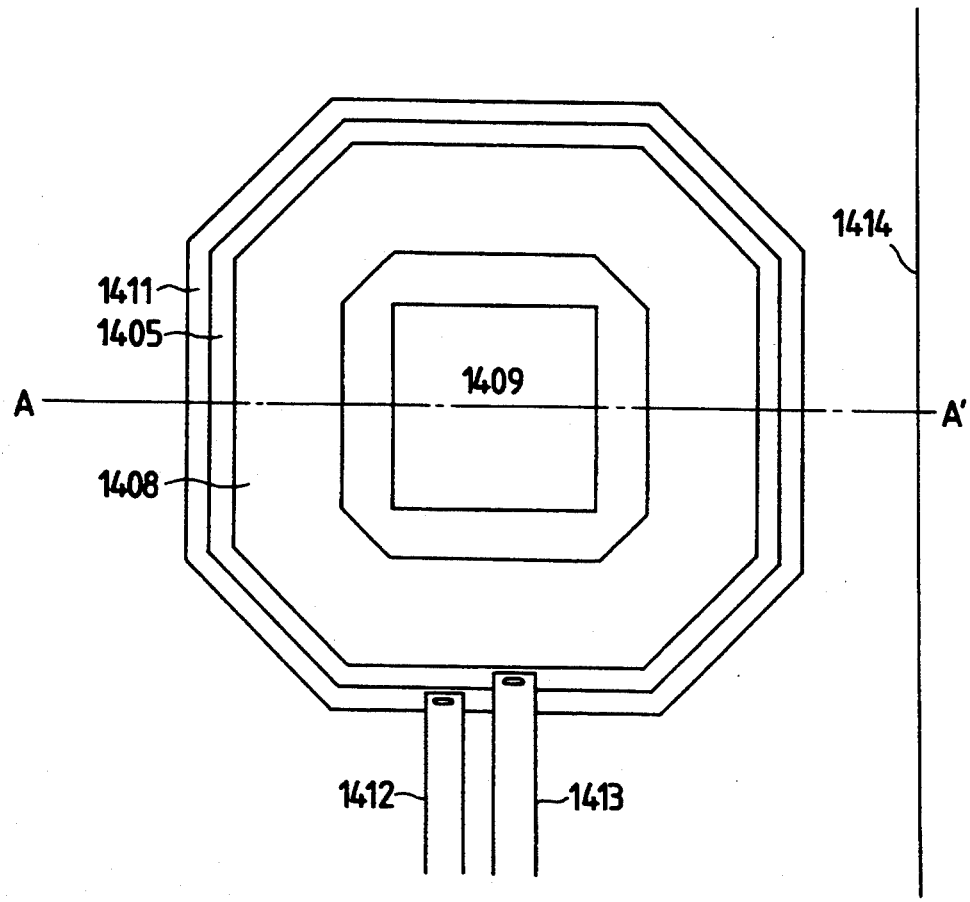

FIG. 17 (a) is a sectional view showing the structure of a high voltage MOSFET according to the present embodiment, and FIG. 17 (b) is a plan view thereof. In these figures, an n-type well layer 1402 is formed on the surface side of a p-type semiconductor substrate 1401 and includes in one end portion thereof a p-type base layer 1403 and an n+-type drain layer 1407. In the base layer 1403, there are formed a p+-type base contact layer 1415 and an n+-type source layer 1404. A gate electrode 1405 is provided through a gate oxidized film on the surfaces of the end portion of the source layer 1404, base layer 1403 and well layer 1402. Also, an input electrode (source electrode) 1411 is connected to the base contact layer 1415 and source layer 1404, while an output pad (drain electrode) 1409 is connected to the drain layer 1407. When the high voltage MOSFET is viewed in a plane, the output pad 1409 is located in the central portion of the MOSFET and, outside the output pad 1409, the drain layer 1407, high resistance region 1408, gate electrode 1405 and input electrode 1411 are arranged at substantially equal distances in this order. Also, for interface with external circuits, there are provided an input wire 1412 to be connected to the input electrode 1411 and a gate wire 1413 to be connected to the gate electrode 1405. This high voltage MOSFET is disposed at a position adjacent to a chip end 1414, and the output pad 1409 is connected to a lead frame through an aerial wire by means of wire bonding. When a bare chip such as a bump is actually mounted, it is not always necessary to dispose the MOSFET at the chip end.

In the high voltage MOSFET having the above structure, since a high voltage output wire from the output pad 1409 intersects the gate electrode 1405 and input electrode 1411 at a sufficient distance of several mm, the electric field concentration due to the high voltage output wire can be relaxed to thereby prevent the deterioration of the device voltage withstanding, so that there can be provided a device of a high reliability. Also, the use of the aerial wire for the high voltage output wire eliminates the need for the high voltage output wire space on the element surface to thereby be able to reduce the device area, so that the whole device can be reduced in size.

In the plane structure of the high voltage MOSFET, besides the structure illustrated in the present embodiment, other structure can be employed. For example, a concentric structure can be employed and the gate electrode and input electrode may be formed in the teeth of a comb.

[Embodiment 9]

Figure 18:
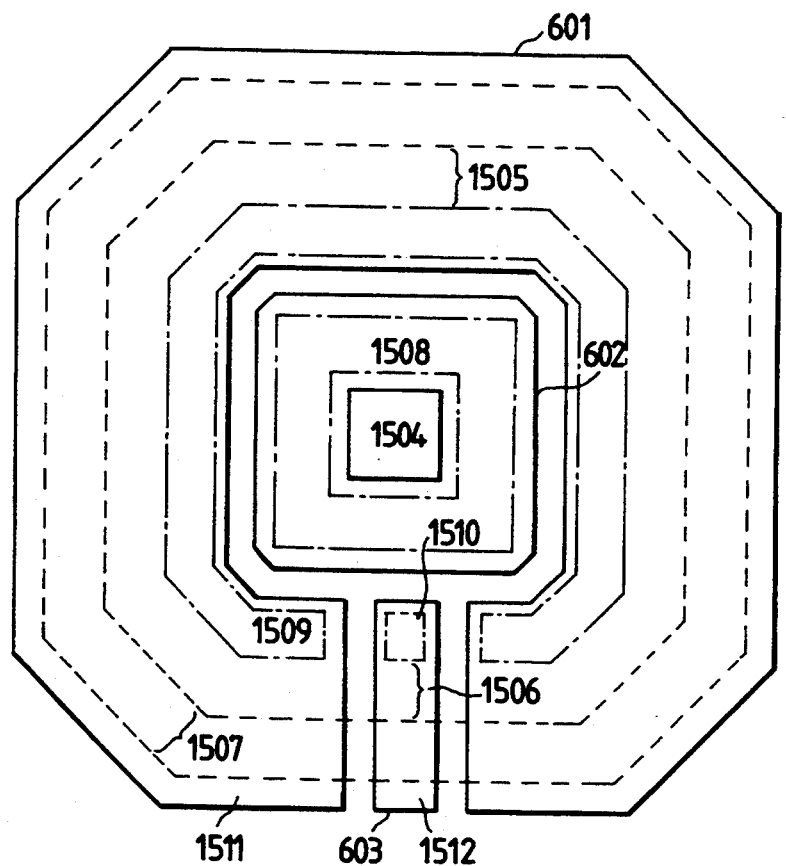
FIG. 18 is a plan view showing the structure of a high voltage MOSFET according to a ninth embodiment of the present invention.
Figure 19:
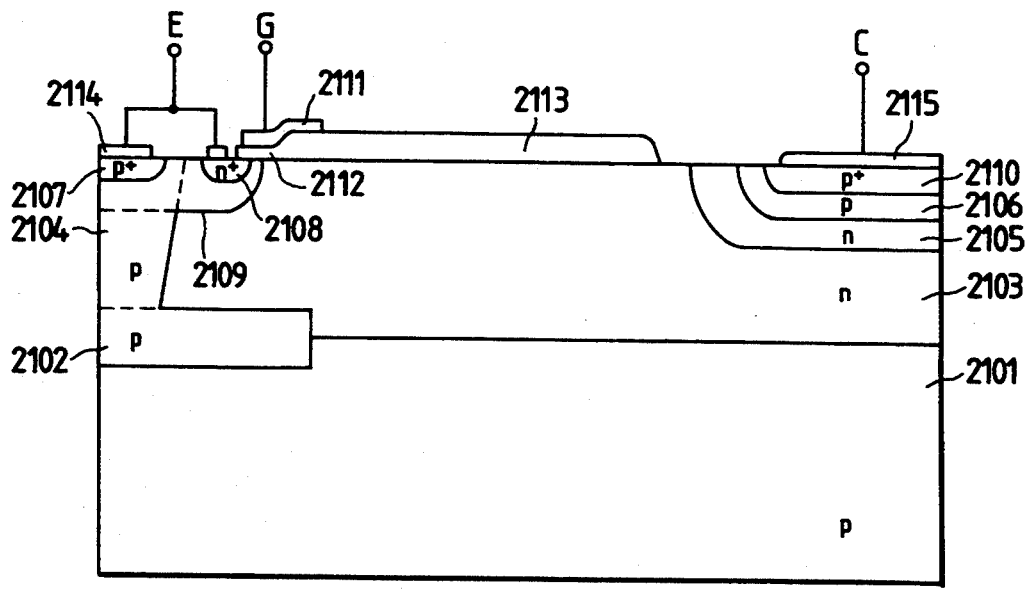
FIG. 19 is a sectional view showing the structure of a conventional high voltage IGBT.
Figure 20A:
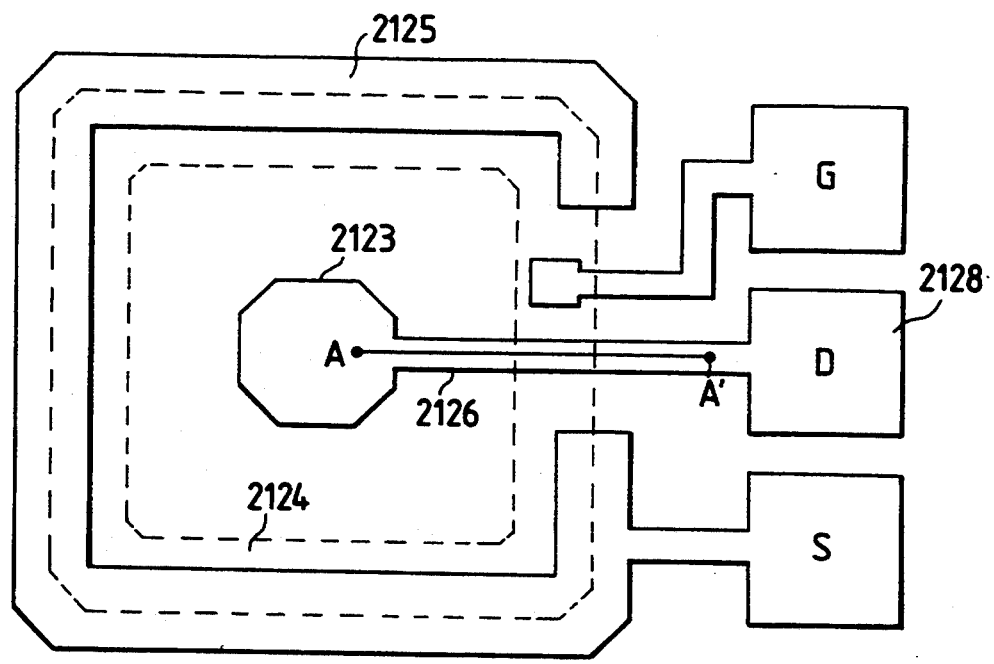
FIG. 20 (a) is a plan view showing the structure of a conventional high voltage MOSFET; and, FIG. 20 (b) is a sectional view of the above MOSFET, taken along the line A—A' shown in FIG. 20 (a).
Figure 20B:
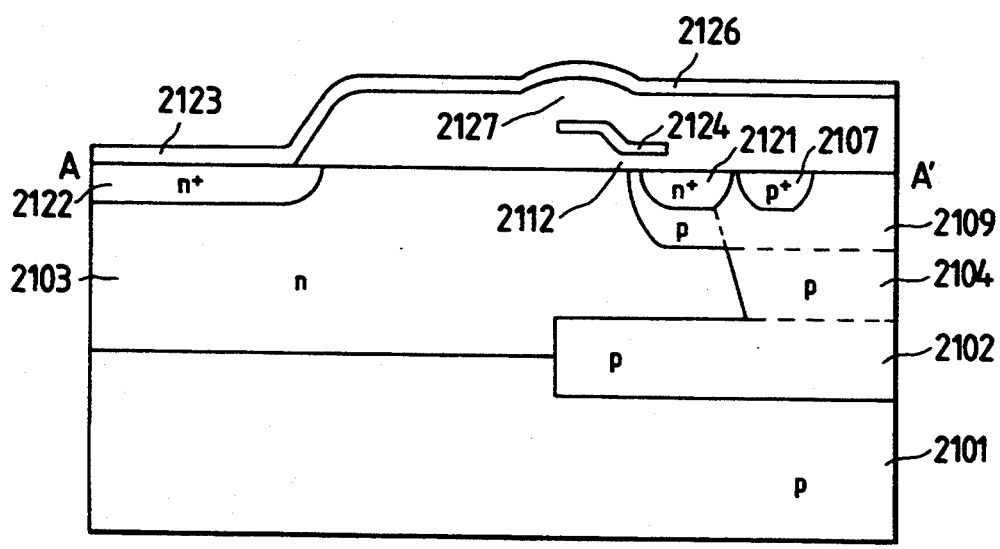

FIG. 18 is a plan view showing the structure of a high voltage IGBT. Here, this high voltage IBGT has the same sectional structure as the high voltage IGBT shown in FIG. 13. In FIG. 18, the high voltage IGBT is a combined device which is composed of three n-type wells. In particular, an output pad 1504 is disposed in the central portion of the device, a second well layer 602 is formed around the output pad 1504, and a first well layer 601 is formed around the second well layer 602 at almost equal distances. And, in the well layer 601, there is formed a third well layer 603 in an element isolation manner. In the first well layer 601, since a high voltage IGBT formed in the well layer 601 requires a voltage resistance of 200 to 1200 V, an emitter region 1511 and a collector region 1509 are positioned with a high resistance region 1505 in the well layer 601 between them, so that the required voltage withstanding can be secured. Also, in the third well layer 603, in order to be able to secure the voltage withstanding of a high voltage MOSFET formed in the well layer 603, a source region 1512 and a drain region 1510 are disposed with a high resistance region 1506 in the well layer 603 between them. Here, the element formed in the second well layer 602 is positioned in an additional circuit region 1508 provided in the periphery of the output pad 1504, the value that it can take in terms of potential is substantially equal to the output pad 1504, collector region 1509 and drain region 1510, and the potential difference thereof is about 10 V. Therefore, the element is formed on the side of the output pad 1504 with respect to the high resistance regions 1505, 1506 of the combined device. Although not illustrated in this embodiment, when there is employed as a combined element an element which is able to take a potential in the neighborhood of the potential of the emitter region 1511, source region 1512 or gate region 1507, a well layer is formed on the lateral side (on the side of the emitter and source) with respect to the high resistance regions 1505, 1506, and an element is disposed within the well layer.

In this high voltage IGBT having the above-mentioned plane structure, similarly to the high voltage MOSFET according to the eighth embodiment, the output pad 1504 disposed in the central portion of the element can be directly connected to the package terminal by an aerial wire by means of wire bonding to thereby eliminate the need that the high voltage wire extends across the high resistance regions 1505 and 1506, so that the deterioration of the voltage withstanding to be caused by the high voltage wire can be prevented. Accordingly, it is possible to secure the reliability of the high output element part which has a great influence on the control circuit part, which in turn makes it possible to enhance the reliability of an integrated circuit device using this high voltage MIS transistor.

As has been described heretofore, in the high voltage MIS transistor according to the present invention, since the well region thereof is formed by the step of injecting ions from the surface side of the semiconductor substrate and by the thermal diffusion step to be performed after the ion injection step, there is eliminated the need for steps such as a buried layer forming step, an epitaxial growth step and the like. Therefore, according to the present invention, in integrating the high voltage output element part consisting mainly of the high voltage MIS transistor and the control circuit part such as a CMOS into the same substrate, because the high voltage output element part can be formed by the same step as the control circuit part, the number of manufacturing steps can be reduced and thus the integrated circuit device can be supplied at low costs. Also, since there is eliminated the need for provision of an isolation diffusion layer, the device area can be reduced. As the impurity concentration of the semiconductor substrate can be set lower than the impurity concentration of the well region, a region, in which a depletion layer spreads when a reverse bias voltage is applied, can be secured on the semiconductor substrate side, so that the voltage blocking capability of the element can be enhanced, that is, the element can obtain high voltage blocking capability. At the same time, because the impurity concentration of the well region can be set at a relatively high level, the resistance of the main current passage can be reduced, which makes it possible to make the low on resistance compatible with the high voltage resistance.

In the present high voltage MIS transistor, due to the fact that a switching element capable of connecting the emitter and base of the main current passage in a short-circuit manner is realized by combining a plurality of elements to thereby be able to draw out quickly minority carriers stored in the well region to the emitter side when the element is turned off, it is possible to reduce greatly a time necessary to sweep out the stored carriers, so that the device is allowed to perform a high speed switching operation.

Further, when a substantially concentrical structure is employed as the plane structure of a semiconductor device including such a high voltage MIS transistor by providing a high voltage output wire from the central portion of the element to the package terminal by use of an aerial wire, there is eliminated the need to extend the high voltage output wire along the element, which can prevent the occurrence of electric field concentration due to the high voltage output wire, thereby improving the reliability of the voltage withstanding of the device. This means that there can be secured the reliability of the MIS part which has a great influence on the control circuit part. Accordingly, the reliability of the integrated circuit device using the present high voltage MIS transistor can be improved.

What is claimed is:

1. A high voltage transistor, comprising:
    a semiconductor substrate having a first conduction type;
    a well region of a second conduction type formed by a first step of injecting ions from a surface side of the semiconductor substrate and by a second step of thermal diffusion;
    a first part comprising: a first base layer of the first conduction type in a first end portion of the well region, a base contact layer of the first conduction type in the first base layer and to which an emitter potential is applied, an emitter layer of the second conduction type in the first base layer and to which the emitter potential is applied, and a gate electrode on an insulation film and extending from the emitter layer to the well region; and
    a second part comprising: a second base layer of the second conduction type in a second end portion of the well region, a collector layer of the first conduction type in the second base layer, and a high concentration contact layer of the first conduction type in the collector layer and to which a collector potential is applied; and
    a high concentration drain layer of the second conduction type between the first part and the second part and an external circuit connected to the drain layer, the external circuit comprising a switching element for selectively connecting the well region to the collector layer in a short-circuit manner.

2. A high voltage transistor, comprising:
    a semiconductor substrate having a first conduction type;
    a well region of a second conduction type formed by a first step of injecting ions from a surface side of the semiconductor substrate and by a second step of thermal diffusion;
    a first part comprising: a first base layer of the first conduction type in a first end portion of the well region, a base contact layer of the first conduction type in the first base layer and to which an emitter potential is applied, an emitter layer of the second conduction type in the first base layer and to which the emitter potential is applied, and a gate electrode on an insulation film and extending from the emitter layer to the well region; and
    a second part comprising: a second base layer of the second conduction type in a second end portion of the well region, a collector layer of the first conduction type in the second base layer, and a high concentration contact layer of the first conduction type in the collector layer and to which a collector potential is applied; and
    a high concentration source layer of the second conduction type in the collector layer and serving as a source of a switching element for selectively connecting the well region to the collector layer in a short-circuit manner, the collector potential being applied to the source layer.

3. A semiconductor device as set forth in claim 2 further comprising a capacitor on the semiconductor substrate for driving the switching element.

4. A semiconductor device as set forth in claim 2 or 3, wherein the switching element is an MISFET.

5. A semiconductor device as set forth in claim 2 or 3, wherein the switching element is a bipolar transistor.

6. A semiconductor device as set forth in claim 2 or 3, wherein, with the collector layer as a center, a high resistant well region existing between the collector layer and the emitter layer is formed substantially concentrically with the emitter layer.

7. A high voltage transistor as set forth in claim 6, wherein the switching element comprises a plurality of semiconductor isolation regions and wherein the semiconductor isolation regions having a high potential near an output potential are disposed in a central portion of the switching element while the semiconductor isolation regions having a low potential near an input potential are disposed in a circumferential portion of the switching element.

* * * * *

UNITED STATES PATENT AND TRADEMARK OFFICE
CERTIFICATE OF CORRECTION

PATENT NO. : 5,436,486
DATED : July 25, 1995
INVENTOR(S) : Naoto FUJISHIMA et al.

It is certified that error appears in the above-indentified patent and that said Letters Patent is hereby corrected as shown below:

Claim 3, column 20, line 62, "claim 2" should read --claim 1 or 2--.

Claim 4, column 20, line 65, "claim 2 or 3" should read --claim 1 or 2--.

Claim 5, column 20, line 67, "claim 2 or 3" should read --claim 1 or 2--.

Claim 6, column 21, line 1, "claim 2 or 3" should read --claim 1 or 2--.

Signed and Sealed this

Twenty-eighth Day of May, 1996

Attest:

BRUCE LEHMAN

*Attesting Officer*  *Commissioner of Patents and Trademarks*